United States Patent
Redmond

(10) Patent No.: US 11,829,948 B1
(45) Date of Patent: Nov. 28, 2023

(54) SYSTEM AND METHOD FOR DETERMINING PRODUCT COUNT INFORMATION USING MAGNETIC SENSORS

(71) Applicant: 7-Eleven, Inc., Irving, TX (US)

(72) Inventor: Matthew O'Daniel Redmond, Denton, TX (US)

(73) Assignee: 7-ELEVEN, INC., Irving, TX (US)

( * ) Notice: Subject to any disclaimer, the term of this patent is extended or adjusted under 35 U.S.C. 154(b) by 0 days.

(21) Appl. No.: 18/171,606

(22) Filed: Feb. 20, 2023

(51) Int. Cl.
  *G06M 9/00* (2006.01)
  *G06Q 10/0875* (2023.01)
  *G01R 15/20* (2006.01)
  *H05K 1/18* (2006.01)
  *A47F 1/12* (2006.01)
  *G01D 5/14* (2006.01)

(52) U.S. Cl.
  CPC ......... *G06Q 10/0875* (2013.01); *A47F 1/126* (2013.01); *G01R 15/202* (2013.01); *G01R 15/207* (2013.01); *H05K 1/181* (2013.01); *G01D 5/142* (2013.01); *G06M 9/00* (2013.01); *H05K 2201/10151* (2013.01)

(58) Field of Classification Search
  CPC ....................................................... A47F 1/126
  See application file for complete search history.

(56) References Cited

U.S. PATENT DOCUMENTS

| | | | |
|---|---|---|---|
| 8,260,456 B2* | 9/2012 | Siegel | A47F 1/126 221/92 |
| 2009/0248198 A1* | 10/2009 | Siegel | G06Q 10/08 700/231 |
| 2010/0017025 A1* | 1/2010 | Lockwood | G07F 9/002 700/240 |
| 2017/0202369 A1* | 7/2017 | Mercier | A47F 5/083 |
| 2018/0242756 A1* | 8/2018 | Åberg | A47F 1/04 |

OTHER PUBLICATIONS

Bryson, Scott, Linear Hall Effect Sensor Array Design, Oct. 2020; 15 pages.

* cited by examiner

*Primary Examiner* — Gene O Crawford
*Assistant Examiner* — Ayodeji T Ojofeitimi
(74) *Attorney, Agent, or Firm* — BAKER BOTTS L.L.P.

(57) ABSTRACT

A system includes a longitudinal rack storing a plurality of packs of cigarettes, a shoe movably attached to the rack, a magnet coupled to the shoe and a longitudinal circuit board arranged along the length of the rack. The circuit board includes an array of sensors along the length of the rack, wherein spacing between each pair of sensors equals a thickness of a pack stored in the rack. Each sensor generates a voltage value depending on a position of the magnet in relation to the sensor. The circuit board further includes a memory storing voltage values generated by the sensors, and a processor configured to monitor voltage values generated by the sensors, detect that a particular sensor has generated a maximum voltage value and determine a number of packs stored in the rack based on a particular number of packs corresponding to the particular sensor.

22 Claims, 11 Drawing Sheets

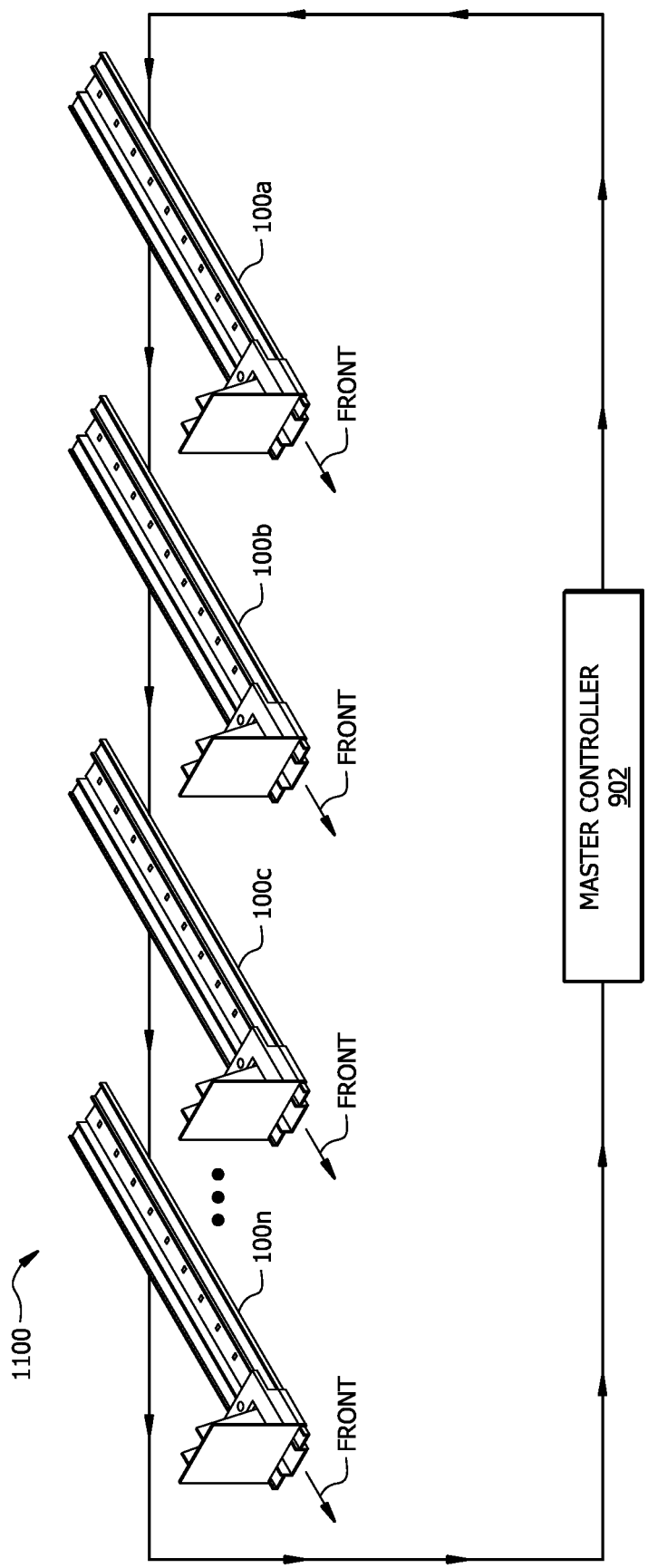

SYSTEM AND METHOD FOR DETERMINING PRODUCT COUNT INFORMATION USING MAGNETIC SENSORS

TECHNICAL FIELD

The present disclosure relates generally to data processing, and more specifically to a system and method for determining product count information using magnetic sensors.

BACKGROUND

Managing inventory on store shelves is a daunting task. Inaccurate data regarding how much product is remaining on store shelves often leads to underutilization of shelf space and loss of revenue. Present inventory tracking procedures are labor intensive, time-consuming and vulnerable to errors. Efficient and accurate tracking of product on store shelves is needed.

SUMMARY

Presently, the only way to count a quantity/number of an item (e.g., packs of cigarettes) stored in a shelf/rack is to manually inspect the rack and count the number of items stored on the rack. For example, to count a number of cigarette packs stored in a cigarette rack a store clerk will need to open the rack and manually count a number of packs stored in the rack. A typical store has hundreds of such racks arranged across several shelves. Thus, keeping track of items stored across several racks/shelves becomes labor intensive and tedious. Further, the present method for tracking inventory on store shelves is prone to human errors. Additionally, incorrect and/or infrequent inspection and recording of the quantity of a product may lead to underutilization of shelf space and loss of revenue, and may further result in inaccurate inventory tracking and replenishment. Thus, conventional techniques are flawed at least partly because they rely on human operation.

The system and methods implemented by the system as disclosed in the present disclosure provide technical solutions to the technical problems discussed above by implementing technology to effectively and efficiently manage inventory on store shelves. The disclosed system and method provide several practical applications and technical advantages. For example, the disclosed system provides the practical application of determining count information for products stored in a rack arranged on a store shelf by using a rack design that employs magnetic sensors to detect a position of a magnet along a length of the rack to determine an item count in the rack. For example, embodiments of the present disclosure provide an intelligent rack design that is used to count packs of cigarettes or other product stored in the rack. The rack includes a shoe movably attached to the rack such that the shoe is pushed back towards the rear end of the rack with each cigarette pack loaded in the rack in front of the shoe, a magnet coupled to the shoe, and a longitudinal circuit board arranged along the length of the rack. The circuit board includes an array of sensors along the length of the rack, wherein each sensor generates a voltage value based on a position of the magnet in relation to the sensor. In one embodiment, a spacing between each pair of the sensors corresponds to a thickness of a pack of cigarettes stored in the rack such that, for any number of packs stored in the rack, the magnet is directly above one of the sensors. In this case, each of the sensors generates a maximum voltage value when the magnet is directly above the sensor. The circuit board further includes a processor that is configured to monitor the voltage value generated by at least a subset of sensors of the array of sensors, detect that a particular sensor of the array of sensors has generated the maximum voltage value, and determine a number of packs of cigarettes actually stored in the rack based on a particular number of packs corresponding to the particular sensor that is detected to generate the maximum voltage value. This embodiment provides the technical advantage of real-time and accurate counting of packs of cigarettes or another product/item of a standard size that is stored in the rack. This helps avoid human errors that would otherwise be associated with a human counting the items stored in the racks. Further by determining product count information for the items stored in a rack quickly and precisely, the disclosed system and methods allow effective and precise monitoring of shelf inventory allowing for the shelves to be promptly restocked when needed thereby avoiding underutilization of shelf space.

The disclosed system and methods provide an additional practical application of intelligently counting packs of cigarettes or other items of non-standard sizes stored in the rack using a single rack design by interpolating a distance between pairs of sensors based on voltage responses of the sensors. In this rack design, the magnet is a longitudinal magnet arranged in conjunction with the shoe such that a longitudinal axis of the magnet is parallel to the longitudinal circuit board. Based on monitoring voltage values generated by at least a subset of sensors, the processor detects that a first sensor has generated a first highest absolute voltage value and a second sensor has generated a second highest absolute voltage value. The processor determines a position of the shoe/magnet along the length of the rack based at least in part upon a first distance of the first sensor from the front end of the rack and a second distance of the second sensor from the front end of the rack, wherein the position of the shoe comprises a distance of the shoe from the front end of the rack. The processor determines a number of packs of the cigarettes of a particular thickness stored in the rack based on the position of the shoe along the length of the rack. By using a single design of rack to count items of different thicknesses that can be stored in the rack, the disclosed system and methods save costs that would otherwise be associated with designing and manufacturing customized rack designs for items of different sizes.

The disclosed system and methods provide an additional practical application of detecting product theft from store shelfs quickly and precisely by using a master controller to detect items removed from a rack based on an intelligent rack design and monitor data interactions involving the removed items processed at an interaction device. As described in accordance with embodiments of the present disclosure, a master controller is communicatively coupled to a rack storing product (such as packs of cigarettes of other items) and an interaction device configured to process data interactions involving the items stored in the rack. The master controller includes a processor that is configured to receive from the rack a first message indicating that a first number of items has been removed from the rack and a universal product code (UPC) associated with a type of the items stored in the rack. The processor monitors communication signals received from the interaction device, wherein the communication signals are indicative of data interactions performed at the interaction device. Based on monitoring the communication signals received from the interaction device, the processor determines whether the first number of packs removed from the rack were processed in one or more data interactions by the interaction device within a pre-configured time. In response to determining that the first number of packs removed from the rack was not processed in one or more data interactions by the interaction device within a pre-configured time, the processor transmits an alert message including a rack number of the rack, the number of items removed from the rack and the UPC associated with the type of the items stored in the rack. Additionally, the alert message may include an identity of a user operating the interaction device at the time the items were removed from the rack. The timely detection and alert of a potential theft along with identity of the user operating the interaction device helps in promptly identifying the party responsible for the theft and recover the stolen product. Further, the system may deter potential thieves from attempting to steal product, which also helps shrinkage reduction.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

FIG. 11 illustrates an example network topology for connecting a plurality of racks shown in FIG. 1, in accordance with certain embodiments of the present disclosure.

DETAILED DESCRIPTION

System Overview

Figure 1:
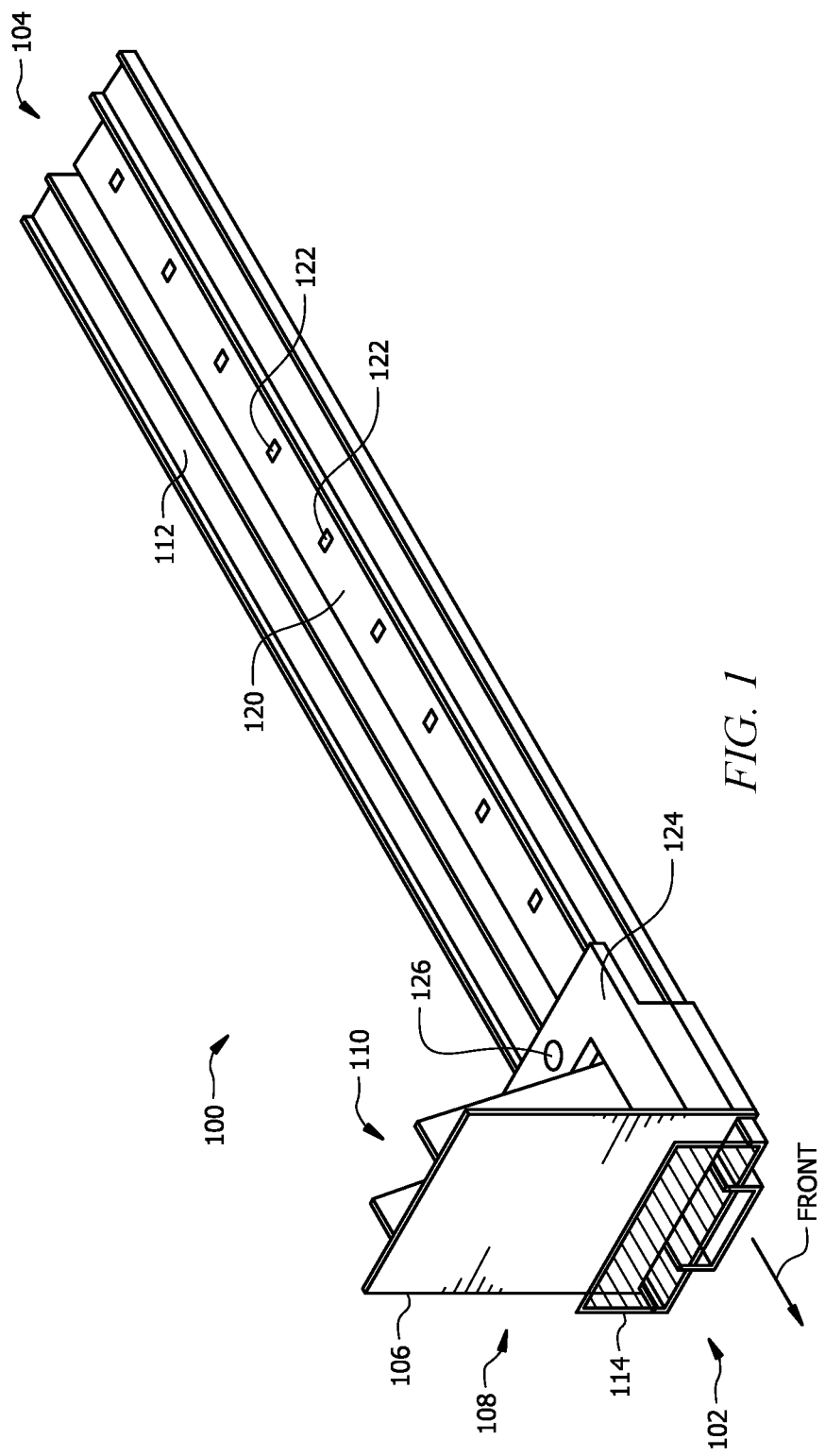
FIG. 1 illustrates an example rack that stores a plurality of packs of cigarettes, in accordance with certain embodiments of the present disclosure.

FIG. 1 illustrates an example rack 100 that stores a plurality of packs of cigarettes, in accordance with certain embodiments of the present disclosure. Although the present disclosure is described in detail with respect to packs of cigarettes, it also applies to other products that may be stored on a rack.

Figure 2A:
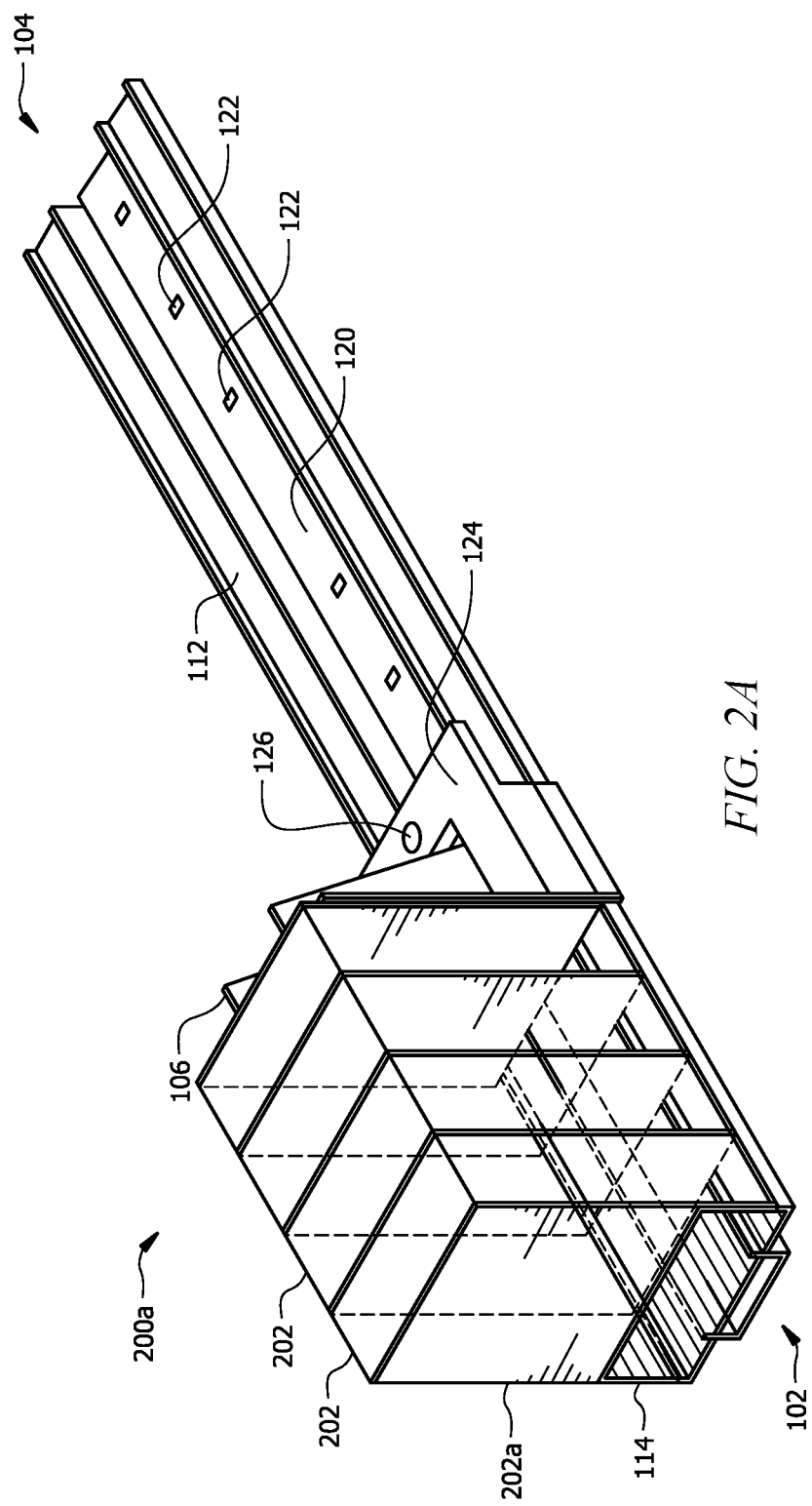
FIGS. 2A and 2B illustrate two different views of the rack storing a plurality of packs of cigarettes, in accordance with certain embodiments of the present disclosure.
Figure 2B:
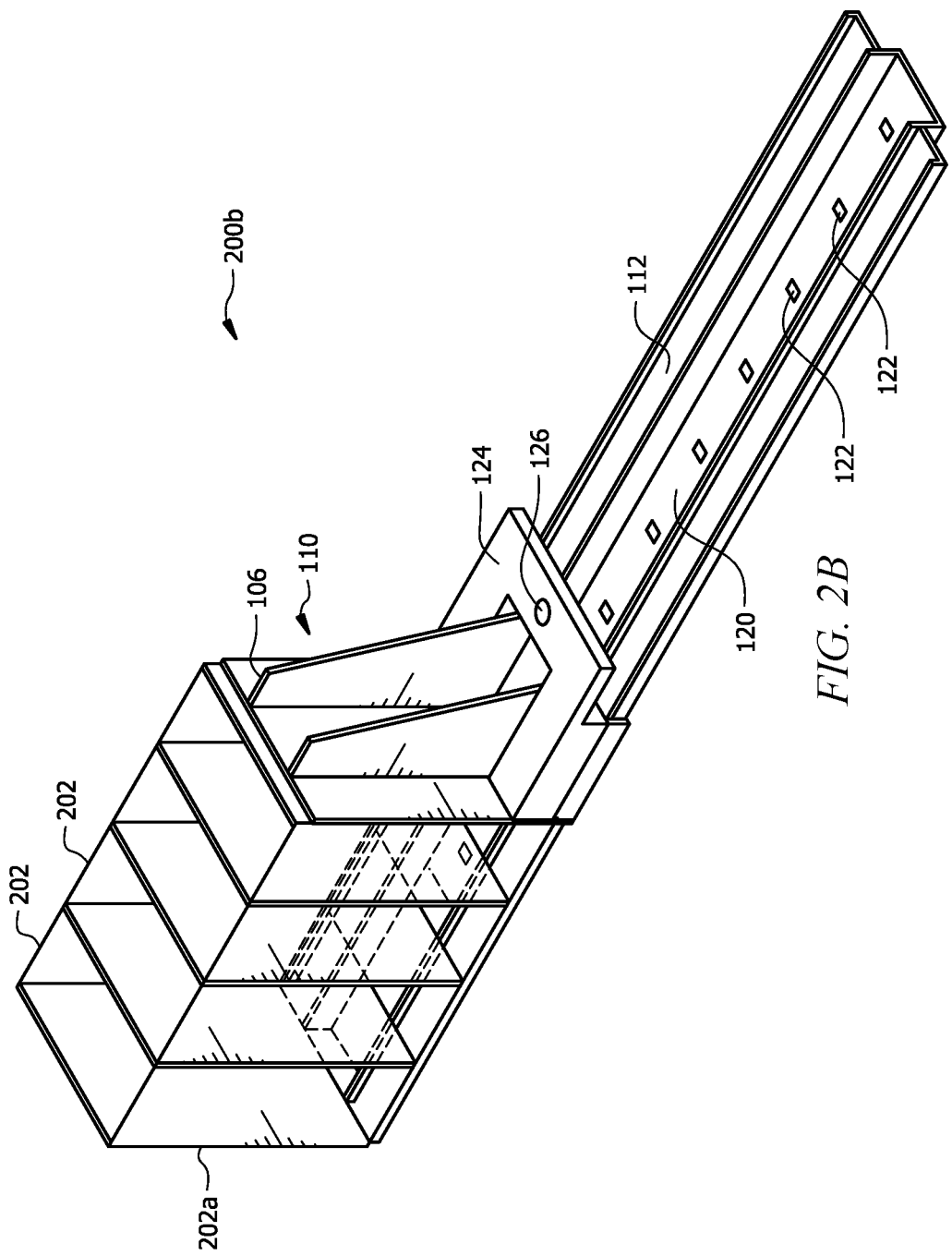

As shown in FIG. 1, rack 100 includes a longitudinal track 112 with a shoe 106 movably attached to the longitudinal track 112 such that the shoe travels back and forth on the track 112 between a front end 102 and a rear end 104 of the rack 100. The rack 100 is designed to store a plurality of packs 202 of cigarettes (as shown in FIGS. 2A and 2B) along the length of the rack 100 between the front end 102 and the rear end 104 of the rack 100. FIGS. 2A and 2B illustrate two different views 200a and 200b respectively of the rack 100 storing a plurality of packs 202 of cigarettes. As shown in FIGS. 2A and 2B packs 202 of cigarettes are placed adjacent to a front end 108 of the shoe 106 (front end 108 of the shoe as shown in FIG. 1) such that the shoe 106 is pushed back towards the rear end 104 of the rack 100 with each pack 202 loaded on to the rack 100. Generally, a mechanism (not shown) is coupled to the shoe 106 that drives the shoe 106 towards the front end 102 of the rack 100 causing a frontmost pack 202a stored in the rack 100 to press against a front wall 114 of the rack 100 near the front end 102 of the rack 100. In some embodiments, this mechanism may include a coiled spring coupled to the shoe 106 that drives the shoe 106 towards the front end 102 of the rack 100. As shown in FIG. 1, the shoe 106 is positioned at the extreme front end 102 of the rack 100 adjacent to the front wall 114 when no packs 202 are stored in the rack 100. Referring to FIGS. 2A and 2B, as packs 202 of cigarettes are loaded on to the rack 100, the shoe 106 is pushed back on the track 112 along the length of the rack 100 towards the rear end 104 of the rack 100.

A typical store generally has a plurality of racks 100 arranged next to each other in one or more shelves, wherein different subsets of the racks 100 may store different types of packs 202 of cigarettes.

Embodiments of the present disclosure discuss techniques to intelligently count packs 202 of cigarettes stored in a rack 100.

Referring back to FIG. 1, rack 100 further includes a longitudinal circuit board 120 arranged along the length of the rack 100. As shown in FIG. 1, circuit board 120 includes an array of sensors 122 arranged along the length of the circuit board 120, wherein a spacing between each pair of the sensors 122 corresponds to a pre-selected spacing. In one embodiment, the spacing between each pair of the sensors 122 equals the thickness of a pack 202 of cigarettes stored in the rack 100. For example, the thickness of most packs 202 of cigarettes is 23.5 mm. Thus, each pair of the sensors 122 may be spaced 23.5 mm apart.

As shown in FIG. 1, rack 100 may further include a magnet carrier 124 positioned adjacent to or attached to a rear end 110 of the shoe 106, such that the magnet carrier 124 moves back and forth along the length of the rack 100 along with the movement of the shoe 106. The magnet carrier 124 is designed to hold a magnet 126 at a pre-selected distance above the circuit board 120. The magnet carrier 124 is dimensioned such that, at any time, the magnet 126 is positioned directly above one of the sensors 122. Each sensor 122 generates a voltage signal corresponding to a strength of magnetic field associated with the magnet 126 as detected by the sensor 122. The magnetic field associated with the magnet 126 detected at a sensor 122 changes as the magnet moves closer to or away from the sensor 122. Thus, in certain embodiments, the voltage signal generated by a sensor 122 corresponds to a position of the magnet 126 in relation to the sensor 122. In one example, each of the sensors 122 is a Hall effect sensor. While certain embodiments of the present disclosure describe aspects of the invention in relation to Hall effect sensors, a person having ordinary skill in the art can appreciate that other types of sensors may also be used that are capable of generating voltage signals corresponding to a detected strength of a magnetic field.

The magnet 126 may correspond to one of several combinations of shapes and sizes. In one embodiment, the magnet 126 is a cylindrical magnet arranged in conjunction with the magnet carrier 124 such that a longitudinal axis of the magnet is perpendicular to the longitudinal axis of the circuit board 120. In this case, a sensor 122 generates a maximum voltage value when the magnet 126 is positioned directly above the sensor 122 or otherwise closest to the sensor 122. In this case, the sensor 122 may not produce a voltage signal or may produce a minimal voltage value when the magnet 126 is not positioned directly above the sensor 122. In an alternative embodiment, the magnet 126 is a cylindrical magnet arranged in conjunction with the magnet carrier 124 such that a longitudinal axis of the magnet 126 is parallel to the circuit board 120. In this case, a sensor 122 generates no voltage signal (e.g., 0 milli volt (mv)) when the center of the magnet 126 is positioned directly above the sensor 122 and the poles of the magnet 126 are positioned on either sides of the sensor 122. In this case, the sensor 122 may generate a positive voltage value when the magnet 126 (e.g., center of the magnet) is positioned on one side of the sensor 122 on the rack 100 (e.g., towards front end 102 or rear end 104) and may generate a negative voltage value when the magnet 126 (e.g., center of the magnet) is positioned on the other side of the sensor 122 on the rack (e.g., towards front end 102 or rear end 104). Additionally, the sensor 122 may generate a larger absolute value as the magnet 126 moves away from the sensor 122.

As described above, the spacing between each pair of the sensors 122 equals the thickness of a pack 202 of cigarettes stored in the rack 100. Additionally, the magnet carrier 124 is designed such that, at any time (e.g., for any number of packs 202 stored in the rack 100), the magnet 126 is positioned directly above one of the sensors 122. For example, in the embodiment when the magnet 126 is arranged in conjunction with the magnet carrier 124 such that a longitudinal axis of the magnet is perpendicular to the circuit board 120, the magnet carrier 124 is designed such that, at any time, the magnet 126 is directly above one of the sensors 122. This means that, at any given time, one of the sensors 122 generates a maximum voltage value. In the alternative embodiment, when magnet 126 is arranged in conjunction with the magnet carrier 124 such that a longitudinal axis of the magnet 126 is parallel to the circuit board 120, the magnet carrier 124 is designed such that, at any time (e.g., for any number of packs 202 stored in the rack 100), the center of the magnet 126 is positioned directly above one of the sensors 122. This means that, at any given time, one of the sensors generates a '0' voltage value or generates a minimal voltage value.

In alternative embodiments, the magnet 126 is coupled to (e.g., attached to or built into) the shoe 106, such that the magnet moves back and for the along the length of the rack 100 along with the movement of the shoe 106. It may be noted that the discussion in embodiments of the present disclosure applies regardless of whether the magnet 126 is arranged in the magnet carrier 124 or is couped directly to the shoe 106. For example, when the magnet 126 is coupled to the shoe 106, the magnet 126 can be arranged in conjunction with the shoe 106 such that, at any time, the magnet 126 is positioned directly above one of the sensors 122. In the embodiment when the magnet 126 is a cylindrical magnet, the magnet 126 may be arranged in conjunction with the shoe 106 such that a longitudinal axis of the magnet is perpendicular to the longitudinal axis of the circuit board 120. In the alternative embodiment, the magnet 126 may be arranged in conjunction with the shoe 106 such that a longitudinal axis of the magnet 126 is parallel to the circuit board 120.

In certain embodiments, each sensor 122 is oriented on the circuit board 120 such that a plane of the sensor 122 is perpendicular to the direction of the magnetic field at a pole of the magnet 126. For example, each sensor 122 is oriented on the circuit board 120 such that a plane of the sensor 122 is coplanar with a plane of the magnet 126 through which the magnetic flux flows. For example, when the magnet 126 is a cylindrical magnet, this means that a plane of each sensor 122 is coplanar with the circular planes on either end of the cylindrical magnet through which the magnetic flux flows.

In one embodiment, a sensor 122 may have multiple planes of measurement, wherein any one of the planes may be used to measure the magnetic field generated by the magnet 126. In such a case, the sensor 122 may be oriented relative to the magnet 126 such that one of the measurement planes of the sensor 126 is perpendicular to the direction of the magnetic field at a pole of the magnet 126.

In an alternative embodiment, a sensor 122 outputs a digital magnetic flux density, for example, in millitesla (mT). In this case, the magnetic flux density measurement generated by the sensor 122 corresponds to a strength of magnetic field associated with the magnet 126 as detected by the sensor 122. It may be noted that while the present disclosure discusses embodiments that use sensors 122 that output voltage measurements, any of the embodiments apply when sensors 122 are used that output magnetic flux density measurements.

Figure 3:
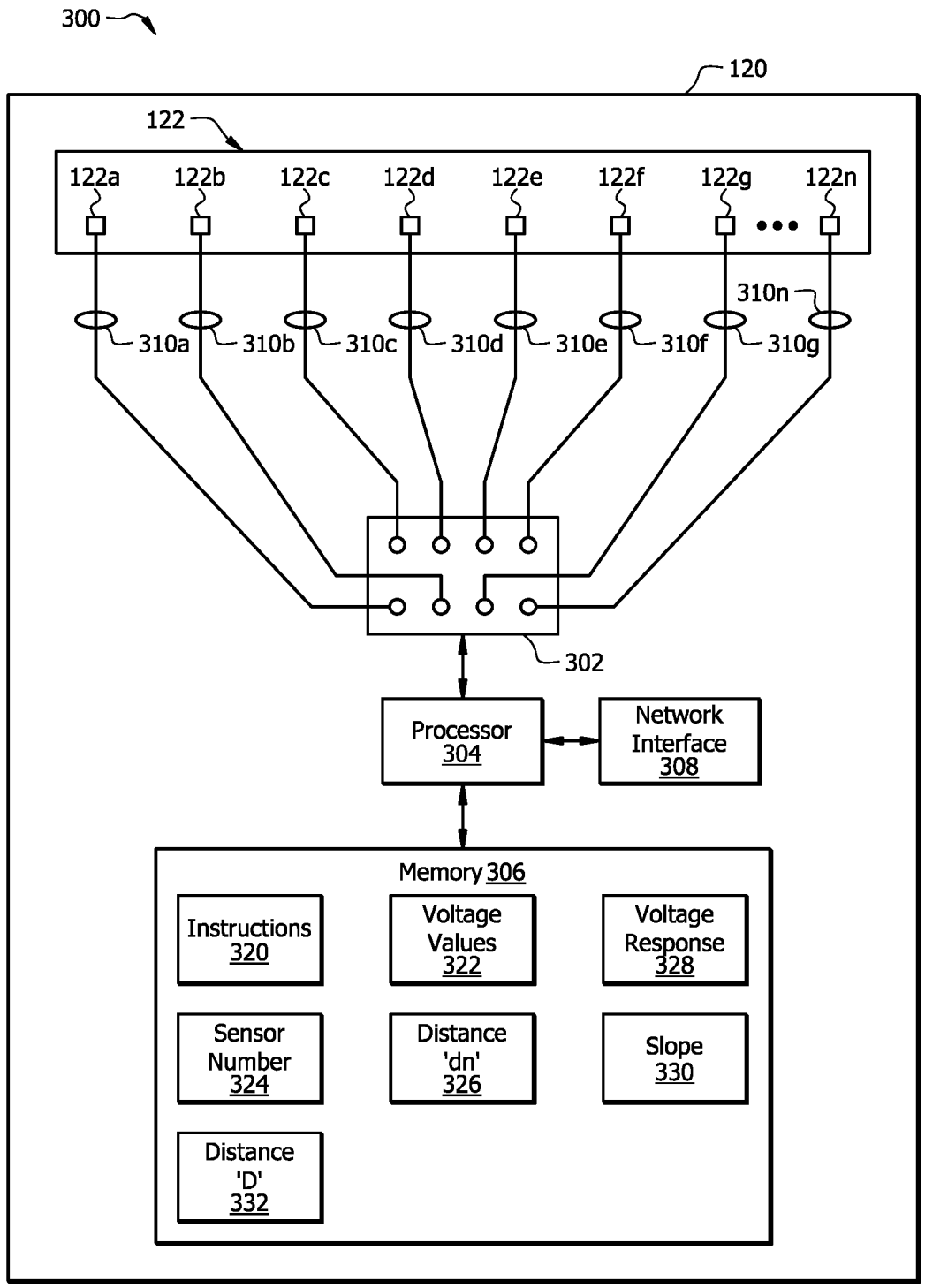
FIG. 3 illustrates a schematic diagram of a circuit board shown in FIG. 1, in accordance with certain embodiments of the present disclosure.

FIG. 3 illustrates a schematic diagram 300 of a circuit board 120 of FIG. 1, in accordance with certain embodiments of the present disclosure. As shown in FIG. 3, circuit board 120 includes an array of sensors 122 (shown as 122a-122n), an array of signal pins 302, a processor 304, a memory 306 and a network interface 308. Each sensor 122 is electrically coupled to one of the signal pins 302 and outputs the voltage signal 310 (shown as 310a-310n) generated by the sensor 122 to the signal pin 302. The processor 304 is communicatively coupled to the array of signal pins 302, memory 306 and network interface 308. In certain embodiments, the processor 304 is configured to run instructions 320 that intelligently count a number of packs 202 of cigarettes stored in a rack 100 based on voltage values 322 corresponding to voltage signals 310 generated by at least a subset of the sensors 122. Each sensor 122 is assigned a pre-selected sensor number 324 that corresponds to the position of the sensor 122 on the circuit board 120. For example, a sensor number 324 assigned to each sensor 122 equals a number of packs 202 stored in the rack 100 when the magnet 126 is directly above the sensor 122. For example, a first sensor 122a on the circuit board 120 which is a first sensor from the front end 102 of the rack is assigned the number '1' representing one pack 202 of cigarettes stored in the rack. The last sensor 122n on the circuit board 120 adjacent to the rear end 104 of the rack 100 is assigned the number 'n' representing 'n' number of packs 202 stored in the rack. Each signal pin 302 is assigned the same number as the sensor 122 that is electrically coupled to the signal pin 302.

The memory 306 is configured to store the voltage values 322 corresponding to the voltage signals generated by the sensors 122 and received at the signal pins 302. Additionally, or alternatively, the memory 306 may be configured to store instructions 320 (e.g., software program/code) that is run by the processor 304 to implement operations described in embodiments of the present disclosure including operations for counting packs 202 of cigarettes.

The processor 304 comprises one or more processors operably coupled to the memory 306. The processor 304 is any electronic circuitry including, but not limited to, state machines, one or more central processing unit (CPU) chips, logic units, cores (e.g. a multi-core processor), field-programmable gate array (FPGAs), application specific integrated circuits (ASICs), or digital signal processors (DSPs). The processor 304 may be a programmable logic device, a microcontroller, a microprocessor, or any suitable combination of the preceding. The processor 904 is communicatively coupled to and in signal communication with the memory 306. The one or more processors 304 are configured to process data and may be implemented in hardware or software. For example, the processor 304 may be 8-bit, 16-bit, 32-bit, 64-bit or of any other suitable architecture. The processor 304 may include an arithmetic logic unit (ALU) for performing arithmetic and logic operations, processor registers that supply operands to the ALU and store the results of ALU operations, and a control unit that fetches instructions from memory and executes them by directing the coordinated operations of the ALU, registers and other components.

The one or more processors 304 are configured to implement various instructions 320. For example, the one or more processors 304 are configured to execute instructions 320 to implement certain operations described in this disclosure. In this way, processor 304 may be a special-purpose computer designed to implement the functions disclosed herein. In one or more embodiments, functions of the processor 304 are implemented using logic units, FPGAs, ASICs, DSPs, or any other suitable hardware. The processor 304 is configured to operate as described with reference to FIGS. 1-10. For example, processor 304 may be configured to perform at least a portion of the methods 400 and 700 as described in FIGS. 4 and 7 respectively.

The memory 306 comprises one or more disks, tape drives, or solid-state drives, and may be used as an over-flow data storage device, to store programs when such programs are selected for execution, and to store instructions and data that are read during program execution. The memory 306 may be volatile or non-volatile and may comprise a read-only memory (ROM), random-access memory (RAM), ternary content-addressable memory (TCAM), dynamic random-access memory (DRAM), and static random-access memory (SRAM).

The memory 306 is operable to store, among other things, voltage values 322 generated by the sensors 122, sensor numbers 324 and instructions 320 for implementing the functionality described herein. As described in further detail below, memory 306 may further store a distance (dn) 326 of each sensor (n) 122 from the front end 102 of the rack 100, a voltage response 328 of each sensor 122 based on voltage values generated by the sensor 122 for different positions of the magnet 126 relative to the sensor 122, and a slope 330 of a response curve associated with the voltage response 328 of each sensor 122. The instructions stored in the memory 306 may include any suitable set of instructions, logic, rules, or code operable to implement the functionality disclosed herein.

The network interface 308 is configured to enable wired and/or wireless communications. The network interface 308 is configured to communicate data between the circuit board 120 and other devices, systems, or domains (e.g. a master controller, cloud infrastructure etc.). For example, the network interface 308 may comprise a Wi-Fi interface, a LAN interface, a WAN interface, a modem, a switch, or a router. The processor 304 is configured to send and receive data using the network interface 308. The network interface 308 may be configured to use any suitable type of communication protocol as would be appreciated by one of ordinary skill in the art.

The processor 304 is configured to monitor the voltage values corresponding to voltage signals received at the signal pins 302 and determine a number of packs 202 of cigarettes stored in the rack 100 based on the voltage values corresponding to voltage signals generated by the sensors 122.

Counting packs 202 of cigarettes of a standard size when a longitudinal axis of the magnet 126 is perpendicular to the circuit board 120

As described above, depending on a number of packs 202 stored in the rack 100 only one of the sensors 122 generates a maximum voltage value. The maximum voltage value generated by a sensor 122 may correspond to a voltage value or a range of voltage values generated by a sensor 122 when the magnet 126 is directly above the sensor 122. As described above, the spacing between each pair of the sensors 122 equals the thickness of a pack 202 of cigarettes stored in the rack 100. Additionally, the magnet carrier 124 is designed such that, at any time (e.g., for any number of packs 202 stored in the rack 100), the magnet 126 is positioned directly above one of the sensors 122. This setup causes the magnet 126 to be positioned directly above one of the sensors 122 regardless of how many packs 202 of cigarettes are stored in the rack 100, causing the respective sensor 122 to generate the maximum voltage value. For example, when a first pack 202 is loaded on to the rack 100, the magnet 126 is positioned directly above the first sensor 122a causing the sensor 122a to generate the maximum voltage value. With each additional pack 202 of cigarettes loaded on to the rack 100, the shoe 106 moves backwards towards the rear end 104 of the rack 100 causing the magnet 126 to move to a position that is directly above the next sensor 122 on the circuit board 120 until when the rack is fully loaded with packs 202 causing the magnet 126 to be positioned directly above the last sensor 122n on the circuit board 120 that is adjacent to the rear end 104 of the rack 100. The positioning of the magnet 126 directly over one of the sensors 122 regardless of a number of packs 202 stored in the rack is possible because the spacing between each pair of the sensors 122 equals the thickness of a pack 202 that is stored in the rack. In one embodiment, when the rack is empty and the shoe is positioned adjacent to the front wall 114, the magnet 126 is not positioned above any of the sensors 122, which means that none of the sensors generates a valid voltage value indicating that the rack is empty.

Figure 4:
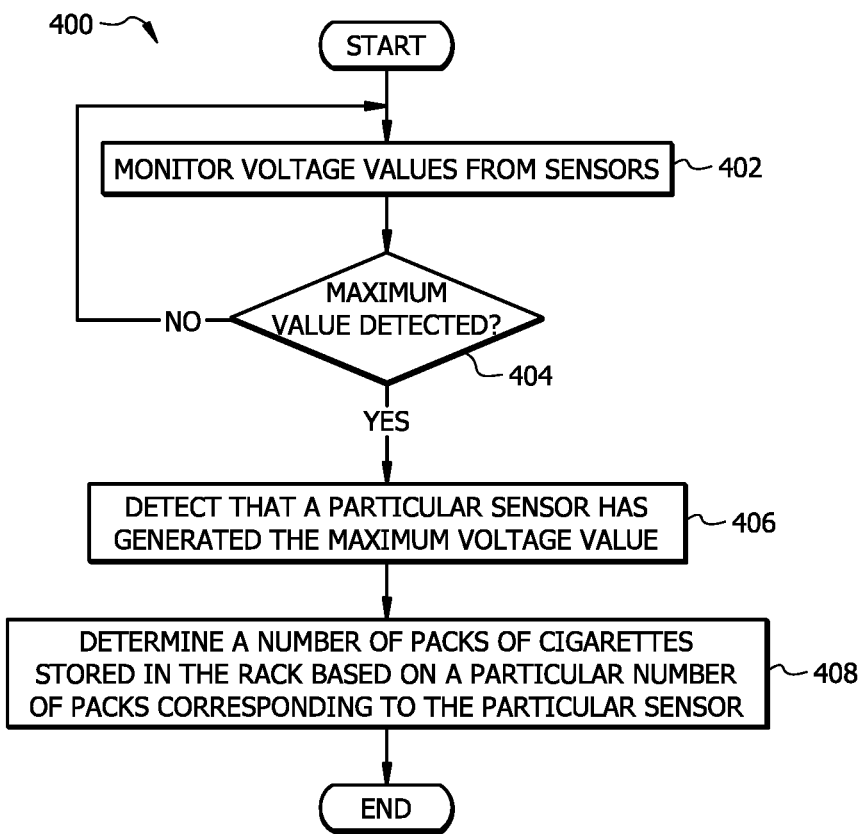
FIG. 4 is a flowchart of an example method for determining the number of packs of cigarettes stored in a rack, in accordance with certain embodiments of the present disclosure.

FIG. 4 is a flowchart of an example method 400 for determining number of packs of cigarettes stored in a rack 100, in accordance with certain embodiments of the present disclosure. Method 400 may be performed by the processor 304 as shown in FIG. 3 and described above.

At operation 402, processor 304 monitors voltage values 322 corresponding to voltage signals 310 generated by at least a subset of the sensors 122 in the circuit board 120. For example, the processor 304 monitors the voltage values 322 generated by the subset of the sensors 122 by monitoring the voltage signals 310 received at the signal pins 302 electrically coupled to the sensors 122 and measuring the voltage values 322 corresponding to the voltage signals 310 using a voltage measuring device (not shown). For example, the circuit board 120 may include a voltage measuring device (e.g., voltmeter) that measures the voltage signals 310 received at the signal pins 302.

It may be noted that only a subset of sensors 122 in the array of sensors 122 may generate a measurable voltage signal 310. For example, when the magnet 126 is positioned over a particular sensor 122, depending on the strength of the magnetic field generated by the magnet 126, the particular sensor 122 and one or more neighboring sensors 122 of the particular sensor 122 may generate a measurable voltage signal 310. The magnetic field may be too low or non-existent at the remaining sensors 122 resulting in the remaining sensors 122 not generating a measurable voltage signal 310.

At operation 404, processor 304 checks whether a maximum voltage value is detected from one of the sensors 122. For example, the processor 304 may monitor the signal pins 302 to check if any one signal pin 302 is receiving a maximum voltage value. Upon detecting a maximum voltage value at a signal pin 302, method 400 proceeds to operation 406.

At operation 406, based on monitoring voltage signals 310 received at the signal pins 302, the processor 304 detects that a particular sensor 122 has generated a maximum voltage value. As described above, a sensor 122 generates a maximum voltage value when the magnet 126 is positioned directly above or closest to the sensor 122.

At operation 408, processor 304 determines a number of packs 202 of cigarettes actually stored in the rack 100 based on the particular sensor 122 that is detected to generate the maximum voltage value. As described above, each sensor 122 is assigned a particular number (e.g., sensor number 324) of packs 202 placed in the rack 100 based on the position of the sensor 122 on the circuit board 120, wherein the particular number corresponding to each sensor equals a number of packs stored in the rack 100 when the magnet is above the sensor or closest to the sensor. Additionally, each signal pin 302 is assigned the same number as the sensor 122 that is electrically coupled to the signal pin 302. Based on the signal pin 302 which received the voltage signal having the maximum voltage value, processor 304 determines the particular number corresponding to the particular sensor 122 that generated the maximum voltage value. The processor assigns the particular number corresponding to the particular sensor 122 as the number of packs 202 actually stored in the rack 100.

It may be noted that the method discussed with reference to FIG. 4 can be used to count packs 202 of cigarettes of any thickness as long as the spacing between each pair of the sensors 122 equals a thickness of the packs of cigarettes stored in the rack. The thickness of most standard sized cigarette packs is 23.5 mm. Thus, in one embodiment, the spacing between each pair of the sensors 122 may be set to 23.5 mm, which would allow the apparatus shown in FIGS. 1, 2A and 2B to be used to count most packs 202 of standard size.

It may be noted that the processor 304 may be configured to count the packs periodically, at pre-scheduled times, in response to receiving a command (e.g., from a master controller), and/or in response to detecting certain events (e.g., change in sensor generating the maximum voltage value).

Counting packs 202 of cigarettes of non-standard sizes with fixed spacing between pairs of sensors 122

Embodiments of the present disclosure describe techniques for intelligently counting packs 202 of cigarettes of any thickness by interpolating a distance between a pair of sensors 122 based on voltage responses of the sensors 122. The techniques discussed in this disclosure allow counting packs 202 of any thickness using a single apparatus (rack 100) shown in FIGS. 1, 2A, 2B and 3. By using a single design of rack to count items of different thicknesses that can be stored in the rack, the disclosed system and methods save processing resources and network bandwidth that would otherwise be associated with implementing a customized rack designs for packs of different sizes.

For ease of illustration and discussion, example embodiments of this disclosure describe the determination of pack count assuming the spacing between each pair of sensors 122 is 20 mm and that the voltage response range of each sensor is −100 mv to +100 mv. However, a person of ordinary skill in the art can appreciate that other sensor spacings and sensors having other response ranges may also be used. For example, the spacing between each pair of sensors may be 23.5 mm which is the thickness of a standard pack of cigarettes (even if non-standard sized cigarette packs 202 are being stored in the rack 100). Further, it may be noted that one or more sensors 122 in the array of sensors 122 arranged on the circuit board 120 may have different voltage response curves and different responses ranges. Further, it may be noted that while embodiments of the present disclosure describe techniques for counting a number of packs 202 of cigarettes stored in a rack 100, the same techniques may be used for counting other products that can be stored in the rack 100.

When the rack 100 is loaded with cigarette packs 202 of non-standard thickness, the magnet 126 may take any position along the length of the circuit board 120. This means that, for a particular number of packs 202 stored in the rack 100, the magnet 126 may be positioned above one of the sensors 122 or between a pair of sensors 122. As described in further detail below, as part of determining a count of packs 202 stored in a rack 100, the processor 304 uses a voltage response of one or more sensors 122 to determine an actual position of the magnet 126 between a pair of consecutive sensors 122. The voltage response of each sensor 122 represents voltage values generated by the sensor 122 for different positions of the magnet 126 in relation to the sensor 122. In certain embodiments, the magnet 126 is chosen as a cylindrical magnet arranged in conjunction with the magnet carrier 124 such that a longitudinal axis of the magnet 126 is parallel to the circuit board 120.

In certain embodiments, each sensor 122 is oriented on the circuit board 120 such that a plane of the sensor 122 is perpendicular to the direction of the magnetic field at a pole of the magnet 126. For example, each sensor 122 is oriented on the circuit board 120 such that a plane of the sensor 122 is coplanar with a plane of the magnet 126 through which the magnetic flux flows. For example, when the magnet 126 is a cylindrical magnet, this means that a plane of each sensor 122 is coplanar with the circular planes on either end of the cylindrical magnet through which the magnetic flux flows.

In one embodiment, a sensor 122 may have multiple planes of measurement, wherein any one of the planes may be used to measure the magnetic field generated by the magnet 126. In such a case, the sensor 122 may be oriented relative to the magnet 126 such that one of the measurement planes of the sensor 126 is perpendicular to the direction of the magnetic field at a pole of the magnet 126.

In an alternative embodiment, a sensor 122 outputs a digital magnetic flux density, for example, in millitesla (mT). In this case, the magnetic flux density measurement generated by the sensor 122 corresponds to a strength of magnetic field associated with the magnet 126 as detected by the sensor 122. It may be noted that while the present disclosure discusses embodiments that use sensors 122 that output voltage measurements, any of the embodiments apply when sensors 122 are used that output magnetic flux density measurements. For example, as part of determining a count of packs 202 stored in a rack 100, the processor 304 may use a magnetic flux density response (e.g., instead of voltage response) of one or more sensors 122 to determine an actual position of the magnet 126 between a pair of consecutive sensors 122. In this case, all voltage measurements may be replaced by magnetic flux density measurements.

Figure 5:
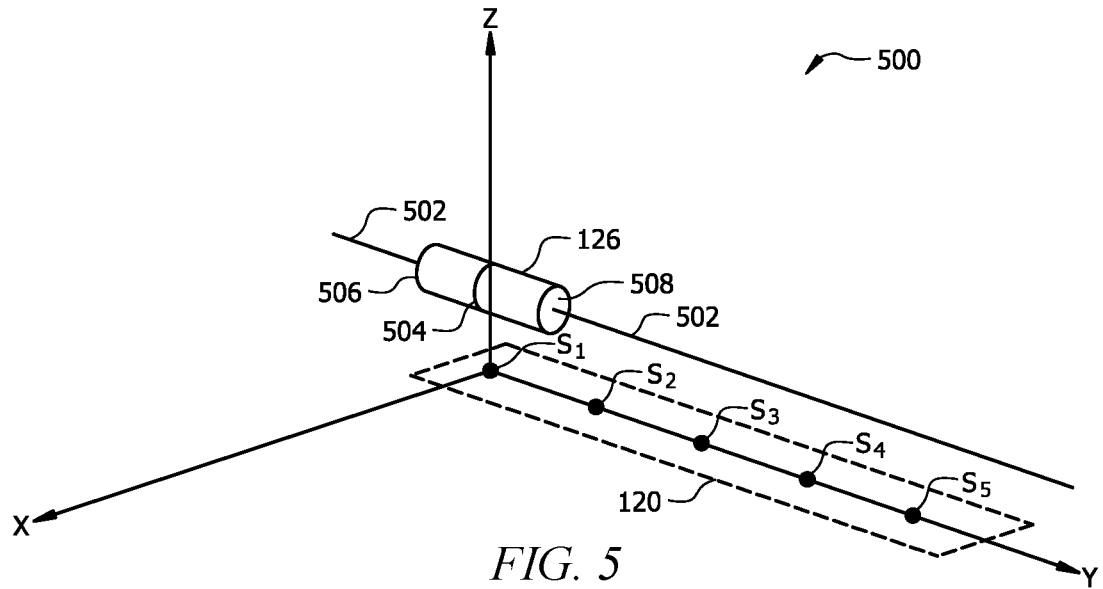
FIG. 5 illustrates an example arrangement of a magnet in relation to the array of sensors, in accordance with certain embodiments of the present disclosure.

FIG. 5 illustrates an example arrangement 500 of the magnet 126 in relation to the array of sensors 122, in accordance with certain embodiments of the present disclosure.

As shown in FIG. 5, the magnet 126 is an elongated cylindrical magnet, wherein a longitudinal axis 502 of the magnet 126 is parallel to the circuit board 120. The example arrangement 500 includes sensors 122 (shown as $S_1$, $S_2$, $S_3$, $S_4$ and $S_5$) arranged on the circuit board 120. It may be noted that reference numeral "122" and "$S_1$-$S_5$" may be interchangeably used in the following discussion to refer to the sensors. In this arrangement, a sensor 122 generates no voltage signal (e.g., 0 millivolt (mv) value) when a center 504 of the magnet 126 is positioned above the sensor 122 and the poles 506 and 508 of the magnet 126 are positioned on either sides of the sensor 122. The sensor 122 may generate a positive voltage value when the magnet 126 (e.g., center 504 of the magnet 126) is positioned on one side of the sensor 122 on the circuit board 120 (e.g., left or right along the length of the circuit board 120) and may generate a negative voltage value when the magnet 126 (e.g., center 504 of the magnet) is positioned on the other side of the sensor 122 on the circuit board 120 (e.g., left or right side along the length of the circuit board 120). For example, a sensor 122 generates a positive voltage value when the center 504 of the magnet 126 is positioned on the left side of the magnet 126 along the length of the circuit board 120 and generates a negative voltage value when the center 504 of the magnet 126 is positioned on the right side of the magnet 126 along the length of the circuit board 120. Additionally, the sensor 122 may generate a larger absolute voltage value as the magnet 126 moves away from the sensor 122 on either side of the sensor 122.

Figure 6:
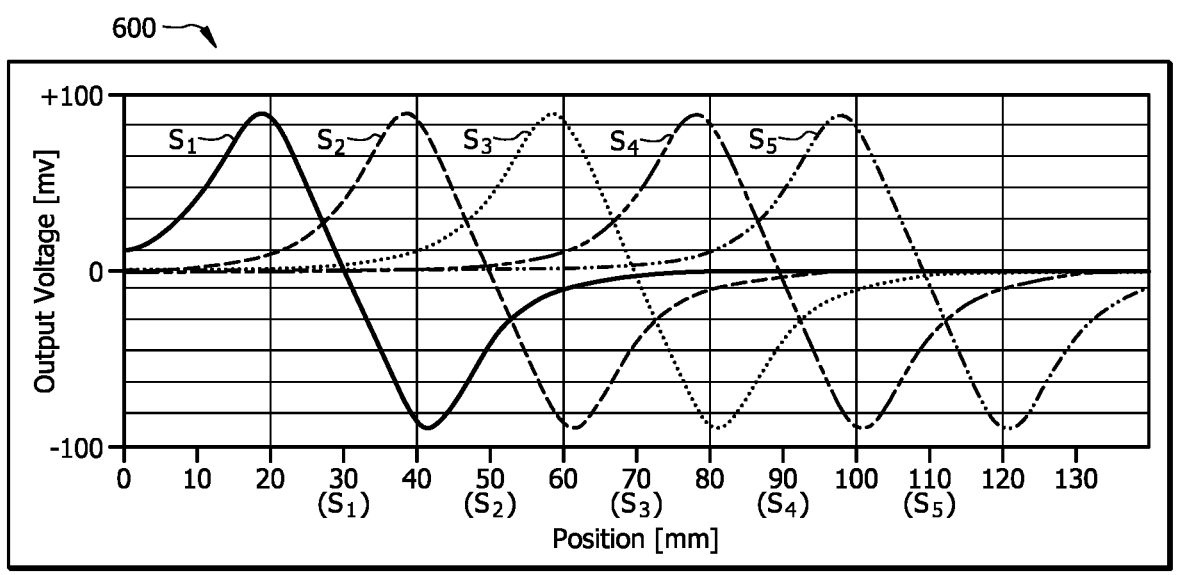
FIG. 6 illustrates an example plot of voltage response relating to each magnet shown in FIG. 5, in accordance with certain embodiments of the present disclosure.

FIG. 6 illustrates example plot 600 of voltage response relating to each magnet shown in FIG. 5, in accordance with certain embodiments of the present disclosure. The X-axis shows a position of the magnet 126 along the length of the rack 100 including a distance from a front end 102 of the rack. In an alternative embodiment, the distances on the X-axis may be measured from a front end of the circuit board 120. It may be noted that the front end of the circuit board 120 may or may not coincide with the front end 102 of the rack 100. Regardless, the following method works when the distances are measured from the front end 102 of the rack or from the front end of the circuit board 120. The following discussion assumes that the distances are measured from the front end 102 of the rack 100.

As shown in FIG. 6, each pair of sensors 122 is spaced at 20 mm with $S_1$ at 30 mm, $S_2$ at 50 mm, $S_3$ at 70 mm, $S_4$ at 90 mm, and $S_5$ at 110 mm from the front end 102 of the rack. The Y-axis shows the voltage response (e.g., in milli volts (mv)) relating to each of the sensors $S_1$-$S_5$ as the magnet moves from the front end 102 of the rack 100 to the rear end 104 of the rack 100. As shown in FIG. 6, each sensor 122 generates a 0 mv when the magnet 126 is positioned above the sensor 122, generates a positive voltage value when the magnet 126 is positioned within a certain distance on the left of the sensor 122, and generates a negative voltage value when the magnet 126 is positioned within a certain distance on the right of the sensor 122. As may be seen from example plot 600, when the magnet 126 is positioned beyond a certain distance on either side of each sensor 122, the sensor 122 does not detect the magnetic field associated with the magnet 126, and thus, generates a 0 mv voltage. As shown in example plot 600, the voltage range of each sensor 122 is −100 mv to +100 mv. The following discussion assumes that the length of the magnet is same as the spacing between each pair of sensors, which in this example is 20 mm. In this case, when the center of magnet 126 is positioned above a particular sensor 122, the neighboring sensors generate half or near half of the maximum absolute voltage values. For example, when the center 504 of the magnet 126 is positioned above $S_2$, $S_2$ generates 0 mv and the neighboring sensors $S_1$ and $S_3$ generate −50 mv (or near −50 mv) and +50 mv (or near +50 mv) respectively. Further, when the center of the magnet 126 is positioned at a halfway point between two consecutive sensors 122, the two sensors generate the maximum or near maximum absolute voltage values. For example, when the center 504 of the magnet 126 is positioned about halfway between $S_1$ and $S_2$, then $S_1$ and $S_2$ each generate −100 mv (or near −100 mv) and +100 mv (or near +100 mv) respectively.

It may be noted that other lengths of the magnet 126 may be chosen. In one embodiment, a maximum spacing between each pair of the sensors 122 equals the length of the magnet 126.

To determine the number of packs 202 stored in the rack 100, the processor 304 is configured to first determine the position of the magnet 126 along the length of the rack 100 by calculating a distance (d) of the magnet from the front end 102 of the rack. The processor 304 then calculates a number of packs 202 stored in the rack based on the determined distance of the magnet from the front end of the rack 100.

The memory 306 may store a voltage response 328 of each sensor 122 based on voltage values 322 generated by the sensor 122 for different positions of the magnet 126 relative to the sensor 122. For example, the memory 306 stores the voltage responses 328 of sensors $S_1$-$S_5$ as shown in FIG. 6. Additionally, or alternatively, the memory 306 may store a slope 330 of a response curve associated with the voltage response 328 of each sensor 122. For example, the memory 306 stores the respective slopes 330 of the response curves associated with sensors $S_1$-$S_5$. The slope 330 associated with a response curve of a sensor 122 indicates an amount of voltage change recorded by the sensor for every mm of distance the center of the magnet 126 moves away from the sensor 122. As may be noted from the example plot 600, the slope associated with the response curve of each sensor $S_1$-$S_5$ is linear. This linear property of the response curves associated with the sensors 122 is used below to determine a position of the magnet between two sensors 122. Additionally, the memory 306 may store a distance (do) 326 of each sensor n from the front end of the rack 100. For example, the memory stores $d_1$=30 mm, $d_2$=50 mm, $d_3$=70 mm, $d_4$=90 mm and $d_5$=110 mm.

Figure 7:
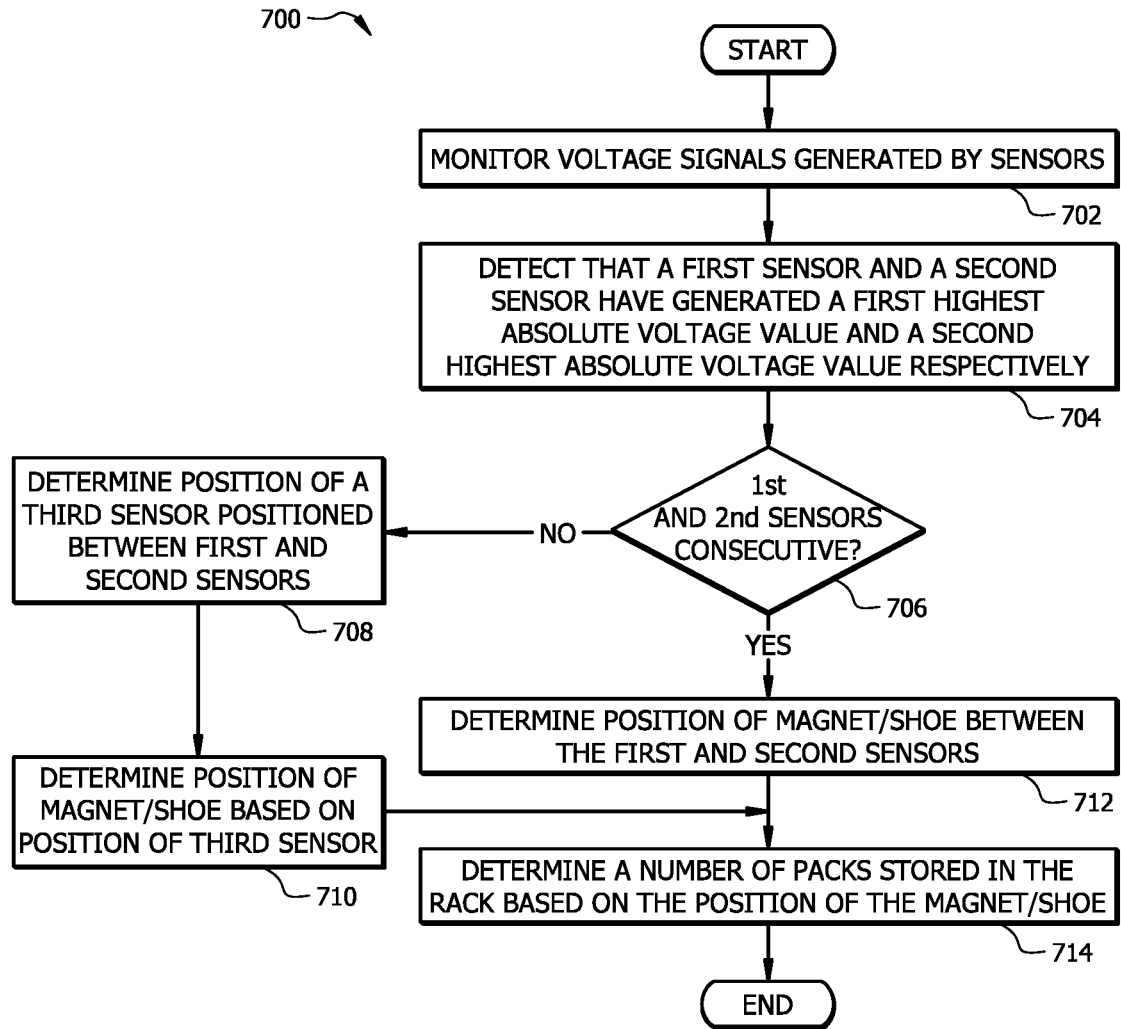
FIG. 7 is a flowchart of an example method for determining a number of packs of cigarettes of non-standard size stored in a rack, in accordance with certain embodiments of the present disclosure.

FIG. 7 is a flowchart of an example method 700 for determining a number of packs of cigarettes of non-standard size stored in a rack 100, in accordance with certain embodiments of the present disclosure. Method 700 may be performed by the processor 304 as shown in FIG. 3 and described above.

At operation 702, processor 304 monitors voltage values 322 corresponding to voltage signals 310 generated by at least a subset of the sensors 122. For example, the processor 304 monitors the voltage values 322 generated by the subset of the sensors 122 by monitoring the voltage signals 310 received at the signal pins 302 electrically coupled to the sensors 122 and measuring the voltage values 322 corresponding to the voltage signals 310 using a voltage measuring device (not shown). For example, the circuit board 120 may include a voltage measuring device (e.g., voltmeter) that measures the voltage signals 310 received at the signal pins.

It may be noted that only a subset of sensors 122 in the array of sensors 122 may generate a measurable voltage signal 310. For example, when the magnet 126 is positioned over a particular sensor 122, depending on the strength of the magnetic field generated by the magnet 126, the particular sensor 122 and one or more neighboring sensors of the particular sensor 122 may generate a measurable voltage signal 310. The magnetic field may be too low or non-existent at the remaining sensors 122 resulting in the remaining sensors 122 not generating a measurable voltage signal 310.

At operation 704, the processor 304 detects that a first sensor 122 has generated a first highest absolute voltage value and a second sensor 122 has generated a second highest absolute voltage value, wherein the first highest absolute voltage value and the second highest absolute voltage value are the two highest voltage values out of the voltage values 322 generated by the sensors 122 in the array. For example, out of the subset of sensors 122 that generate a voltage value, two sensors 122 of the subset may generate the highest two voltage values of all the voltage values generated by the subset of sensors 122. In other words, the processor 304 is configured to select two sensors 122 that are detected to have generated the two highest voltage values out of the voltage values generated by the subset of the sensors 122.

At operation 706, the processor 304 checks whether the first sensor 122 and the second sensor 122 are consecutive sensors 122 on the circuit board 120. The processor 304 may make this determination based on the signal pins 302 that received the first and second highest absolute voltage values. For example, each signal pin 302 may correspond to a pin number. As described above, each signal pin 302 is electrically coupled to a single sensor 122 and receives the voltage signal generated by that sensor 122. A pin number of a signal pin 302 may correspond to the position of the sensor 122 electrically coupled to the signal pin 302. For example, signal pin 1 may correspond to sensor $S_1$, signal pin 2 may correspond to sensor $S_2$ and signal pin n may correspond to sensor $S_n$. Thus, the processor 304 may determine the positions of the first and second sensors 122 on the circuit board 120 by examining the pin numbers of the signal pins 302 that received the respective voltage signals 310 from the first and second sensors 122. When the pin numbers of the two signal pins that correspond to the first and second sensors 122 are consecutive, the processor 304 determines that the first and second sensors 122 are consecutively arranged on the circuit board 120. On the other hand, when the pin numbers of the two signal pins that correspond to the first and second sensors 122 are not consecutive, the processor 304 determines that a third sensor 122 is disposed between the first and second sensors 122 on the circuit board 120. It may be noted that based on the design of the rack 100 described in this disclosure, only the above described two alternatives are possible with regard to the placement of the first and second sensors 122 that generate the two highest voltage values. In other words, the first and second sensors 122 are either consecutively arranged on the circuit board 120 or a single third sensor 122 is disposed between the first and second sensor 122.

When the processor 304 determines that the first sensor 122 and the second sensor 122 are not consecutive sensors and that a third sensor 122 is disposed between the first and second sensors 122, method 700 proceeds to operation 708. At operation 708, processor 304 determines the position of the third sensor 122 that is disposed between the first sensor 122 and the second sensor 122. As described above, the memory 306 stores the distance 326 of each sensor 122 from the front end of the rack 100. The processor 304 may determine the position of the third sensor 122 by obtaining from the memory 306 the distance of the third sensor 122 from the front end of the rack 100. For example, referring back to FIG. 5, if the first sensor is $S_2$ and the second sensor $S_4$, the third sensor disposed between $S_2$ and $S_4$ is $S_3$. The processor 304 obtains from the memory 306 the distance 326 of the sensor $S_3$ from the front end of the sensor. For example, referring back to the example plot 600 shown in FIG. 3, the distance of $S_3$ from the front end of the sensor is 70 mm.

At operation 710, processor 304 determines the position of the shoe 106 along the length of the rack 100 based at least in part upon the distance of the third sensor 122 from the front end of the rack 100. As described above, the position of the shoe 106 corresponds to the position of the magnet 126 along the length of the rack 100. Thus, the processor 304 determines the position of the magnet 126 along the length of the rack 100. The assumption here is that when the first and second sensors 122 generate the highest two voltage values, then the magnet 126 is positioned above the third sensor 122 that is disposed therebetween. As described above, when the center of magnet 126 is positioned above a particular sensor 122, the neighboring sensors generate half (or near half) the maximum absolute voltages. For example, when the center 504 of the magnet 126 is positioned above $S_3$, $S_3$ generates 0 mv (or near 0 my) and the neighboring sensors $S_2$ and $S_4$ generate −50 mv (or near −50 mv) and +50 mv (or near +50 mv) respectively. Thus, when $S_2$ and $S_4$ generate the two highest absolute voltage values of 50 mv or near 50 mv, it may be assumed that the center of the magnet 126 is positioned above $S_3$. In this case, the position of the magnet 126 is same as the position of $S_3$. Thus, the processor 304 determines the distance 326 of the third sensor from the front end of the rack 100 as the distance $(d_m)$ of the magnet 126 from the front end of the rack 100. For example, the processor 304 determines the distance of sensor S3 ($d_{S3}$=70 mm) from the front end of the rack 100 as the distance $(d_m)$ of the magnet from the front end 102 of the rack 100.

In one embodiment, as an optional confirmation step, the processor 304 may detect that the third sensor 122 generates a 0 mv or near 0 mv voltage value, which serves as a confirmation that the center of the magnet 126 is positioned above the third sensor 122.

When the processor 304 determines at operation 706 that the first sensor 122 and the second sensor 122 are consecutive sensors, method 700 proceeds to operation 712.

At operation 712, in response to determining that the first sensor 122 and the second sensor 122 are consecutive sensors on the circuit board 120, the processor 304 determines a position of the magnet 126 between the first and second sensors 122 based on the positions of the two sensors 122 on the circuit board, the voltage responses of the two sensors 122, and the actual voltage values 322 generated by the two sensors. The assumption here is that when two consecutive sensors 122 generate the two highest absolute voltage values, the magnet 126 (e.g., center of the magnet 126) is positioned between the two consecutive sensors 122. For example, if the consecutively positioned first sensor and second sensor are $S_2$ and $S_3$ respectively, this indicates that the center of the magnet 126 is positioned between sensors $S_2$ and $S_3$.

Given that the magnet 126 (e.g., center of the magnet 126) is positioned between the first sensor 122 and the second sensor 122, the processor 304 may determine a distance ($d_m$) of the magnet 126 (e.g., center of the magnet 126) from the front end 102 of the rack 100 based on the following equation (1):

$$dm = \frac{\left(dS1 + \left[\frac{VS1}{\text{Slope } S1}\right]\right) + \left(dS2 - \left[\frac{VS2}{\text{Slope } S2}\right]\right)}{2} \quad (1)$$

wherein:
$d_m$=distance of the magnet from the front end 102 of the rack 100;
dS1=distance 326 of the first sensor 122 from the front end 102 of the rack 100;
VS2=Actual voltage value 322 generated by the first sensor 122;
SlopeS1=Slope 330 of a response curve associated with the voltage response 328 of the first sensor 122;
dS2=distance 326 of second sensor 122 from the front end 102 of the rack 100;
VS2=Actual voltage value 322 generated by the second sensor 122;
SlopeS2=Slope 330 of a response curve associated with the voltage response 328 of the second sensor 122.

As described above, the memory 306 stores the distance 326 of each sensor 122 from the front end of the rack 100. The memory 306 also stores the slope 330 of a response curve associated with the voltage response 328 of each sensor 122. Thus, in the above example, processor 304 obtains the values of dS1, SlopeS1, dS2 and SlopeS2 from the memory to calculate the distance (dm) of the magnet 126 from the front end of the rack 100. As noted above, the determined position of the magnet 126 corresponds to the position of the shoe 106 along the length of the rack 100.

Referring back to FIG. 6, in an example calculation of dm assuming that the first sensor is $S_2$ and the second sensor is $S_3$, if dS1=50 mm, SlopeS1=(−10) mv/mm, dS2=70 mm, SlopeS2=(+10) mv/mm, VS1=−100 my and VS2=+100 mv, dm may be calculated according to equation (a) as follows:

$$dm = \frac{\left(50 + \left[\frac{-100}{-10}\right]\right) + \left(70 - \left[\frac{100}{10}\right]\right)}{2} = \frac{60 + 60}{2} = 60 \text{ mm}$$

Thus, the distance of the magnet 126 from the front end of the sensor is 60 mm.

At operation 714, processor 304 determines a number of packs 202 of cigarettes actually stored in the rack based at least in part on the distance (dm) (e.g., dm determined in the previous operation 712) of the magnet 126 from the front end of the rack 100.

The processor 304 may determine a number (N) of packs 202 actually stored in the rack based on the following equation (2):

$$N = \frac{dm}{D} \quad (2)$$

wherein:
dm=distance of the magnet 126 from the front end 102 of the rack 100; and
D=a distance the magnet 126/shoe 106 moves for every pack 202 loaded in the rack 100.

In certain embodiments, for a pack 202 of a particular thickness, the memory 306 stores distance (D) 332 the magnet 126 moves for every pack 202 loaded in the rack 100. It may be noted that the value of D 332 differs for every pack or product of a different thickness.

Following the example from the previous paragraph, if dm=60 mm and D=20 mm, then the number of packs (N) actually stored in the rack can be calculated as:

$$N = \frac{60}{20} = 3 \text{ packs}$$

In certain embodiments, the value of D 332 may be determined in a calibration step. For example, in response to receiving a command to calibrate a rack 100, the processor 304 may initiate a calibration mode. While the processor 304 is in the calibration mode, a user (e.g., store clerk) may load a known numbers of packs 202 of a particular thickness in the rack 100. Every time a particular number of packs 202 of the particular thickness is loaded in the rack 100, the processor 304 calculates a distance (dm) of the magnet 126 from the front end 102 of the rack 100 for the known number of packs 202 stored in the rack 100. The processor 304 may determine a distance (D) 332 the magnet 126 moves for every pack 202 of the particular thickness that is loaded in the rack 100 based on the values of dm associated with at least two different known numbers of packs 202 that are loaded in the rack 100.

For example, in a first step, while the processor 304 is in the calibration mode, the user loads one pack 202 of the particular thickness in the rack 100. In response, the processor calculates the dm=20 mm. In a second step, the user loads 3 packs 202 of the same particular thickness in the rack 100. In response, the processor calculates the dm=60 mm. The processor 304 may determine a distance (D) 332 the magnet 126 moves for every pack 202 of a particular thickness that is loaded in the rack 100 based on the following equation (3):

$$D = \frac{d2 - d1}{C2 - C1} \quad (3)$$

wherein:
C1=a first known number of packs 202 stored in the rack 100;
d1=distance of the magnet 126 from the front end of the rack 100 corresponding to the first known number of packs 202 stored in the rack 100;

C2=a second known number of packs 202 stored in the rack 100, wherein C2>C1; and d2=distance of the magnet 126 from the front end of the rack 100 corresponding to the second known number of packs 202 stored in the rack 100.

Following the above example, processor 304 may calculate D 332 as:

$$D = \frac{60 - 40}{3 - 1} = 20 \text{ mm per pack}$$

This means that the magnet 126 moves 20 mm along the length of the rack 100 for every pack 202 of the particular size that is loaded on the rack 100.

Once the processor 304 has determined a value of D 332 for the pack 202 of the particular thickness, the processor 304 may exit out of the calibration mode and store the determined value of D 332 in the memory 306 for subsequent use in calculating packs 202 of the same particular thickness actually stored in the rack 100. It may be noted that since the value of D 332 differs for packs 202 having different thicknesses, the calibration step described above may need to be performed before storing packs 202 of an uncalibrated thickness in the rack 100.

It may be noted that while the method 700 is described in relation to counting a number of packs 202 of cigarettes, the method 700 may be used to count any product/item of uniform thickness that can be stored in the rack 100.

Counting packs 202 of cigarettes of a standard size when a longitudinal axis of the magnet 126 is parallel to the circuit board 120

Figure 8:
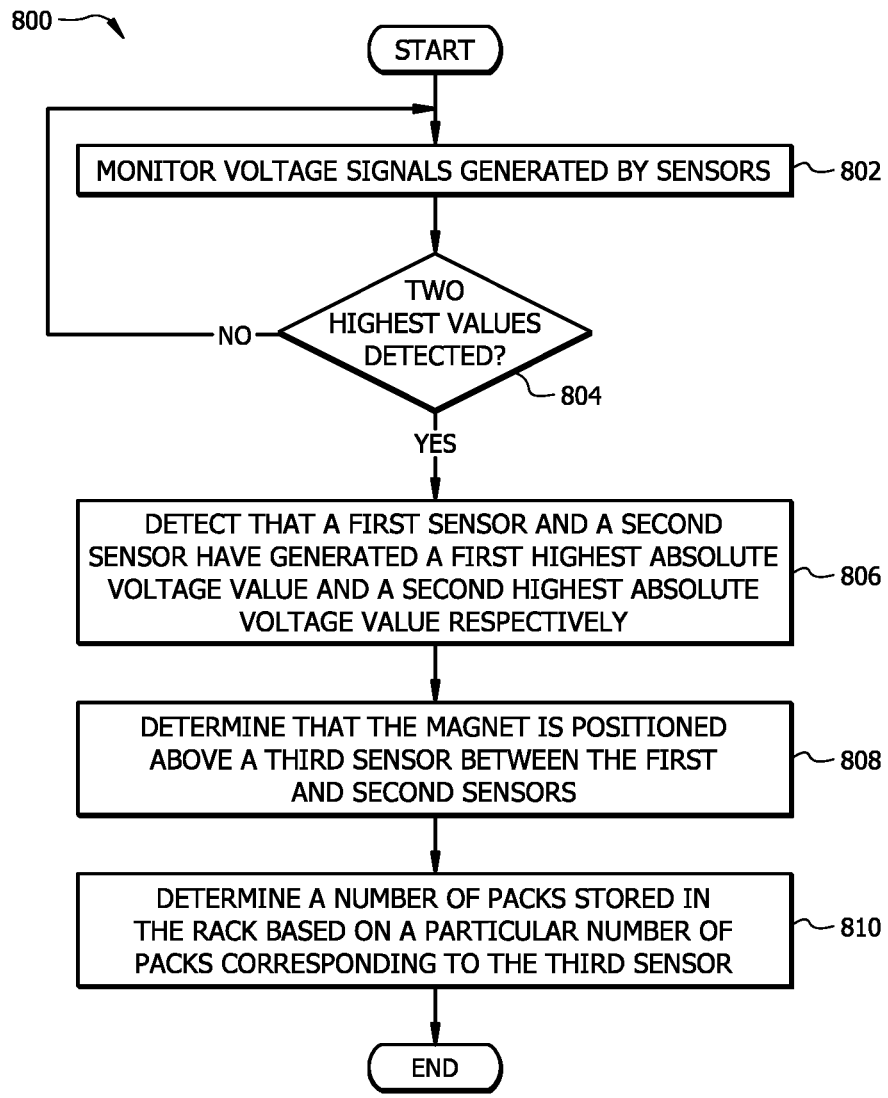
FIG. 8 is a flowchart of an example method for determining a number of packs of cigarettes of a standard size stored in a rack, in accordance with certain embodiments of the present disclosure.

FIG. 8 is a flowchart of an example method 800 for determining a number of packs of cigarettes of a standard size stored in a rack 100, in accordance with certain embodiments of the present disclosure. Method 800 may be performed by the processor 304 as shown in FIG. 3 and described above.

At operation 802, processor 304 monitors voltage values 322 corresponding to voltage signals 310 generated by at least a subset of the sensors 122. For example, the processor 304 monitors the voltage values 322 generated by the subset of the sensors 122 by monitoring the voltage signals 310 received at the signal pins 302 electrically coupled to the sensors 122 and by measuring the voltage values 322 corresponding to the voltage signals 310 using a voltage measuring device (not shown). For example, the circuit board 120 may include a voltage measuring device (e.g., voltmeter) that measures the voltage signals 310 received at the signal pins 302.

It may be noted that only a subset of sensors 122 in the array of sensors 122 may generate a measurable voltage signal 310. For example, when the magnet 126 is positioned over a particular sensor 122, depending on the strength of the magnetic field generated by the magnet 126, the particular sensor 122 and one or more neighboring sensors of the particular sensor 122 may generate a measurable voltage signal 310. The magnetic field may be too low or non-existent at the remaining sensors 122 resulting in the remaining sensors 122 not generating a measurable voltage signal 310.

At operation 804, processor 304 checks whether two highest voltage values 322 are detected across the voltage values 322 generated by the subset of the sensors 122. For example, the processor 304 may receive the two highest voltage values 322 on two of the signal pins 302. If the processor 304 detects two highest voltage values 322 on two of the signal pins 302 method 800 proceeds to operation 806.

At operation 806, the processor 304 detects that a first sensor 122 has generated a first highest absolute voltage value and a second sensor 122 has generated a second highest absolute voltage value, wherein the first highest absolute voltage value and the second highest absolute voltage value are the two highest voltage values out of the voltage values 322 generated by the sensors 122 in the array. For example, out of the subset of sensors 122 that generate a voltage value, two sensors 122 of the subset may generate the highest two voltage values of all the voltage values 322 generated by the subset of sensors 122. In other words, the processor 304 is configured to select two sensors 122 that are detected to have generated the two highest voltage values out of the voltage values 322 generated by the subset of the sensors 122.

As described above, when the spacing between each pair of the sensors 122 equals a thickness of the pack 202 stored in the rack 100, the magnet carrier 124 may be designed such that for any number of packs 202 stored in the rack 100, the center of the magnet 126 is positioned above one of the sensors 122. As also described above, when the center 504 of the magnet 126 is positioned above a particular sensor 122, the neighboring sensors generate half (or near half) the maximum absolute voltages. For example, when the center 504 of the magnet 126 is positioned above sensor $S_3$, the sensor $S_3$ generates 0 mv (or near 0 mv) and the neighboring sensors $S_2$ and $S_4$ generate −50 mv (or near −50 mv) and +50 mv (or near +50 mv) respectively. Thus, when $S_2$ and $S_4$ generate the two highest absolute voltage values of 50 mv or near 50 mv, it may be assumed that the center of the magnet 126 is positioned above $S_3$. In this case, the position of the magnet 126 is same as the position of $S_3$.

Thus, at operation 808, in response to detecting that the first sensor 122 has generated a first highest absolute voltage value and the second sensor 122 has generated a second highest absolute voltage value, the processor 304 determines that the magnet 126 (e.g., center of the magnet 126) is positioned above a third sensor 122 that is disposed between the first sensor 122 and the second sensor 122, wherein the first sensor 122, third sensor 122 and second sensor 122 are consecutive sensors 122 on the circuit board 120.

At operation 810, processor 304 determines a number of packs 202 of cigarettes actually stored in the rack 100 based on a particular number of packs 202 corresponding to the third sensor 122 that is disposed between the first sensor 122 and the second sensor 122. As described above, each signal pin 302 may correspond to a pin number. Further, each signal pin 302 is electrically coupled to a single sensor 122 and receives the voltage signal 310 generated by that sensor 122. A pin number of a signal pin 302 may correspond to the position of the sensor 122 electrically coupled to the signal pin 302. For example, signal pin 1 may correspond to sensor $S_1$, signal pin 2 may correspond to sensor $S_2$ and signal pin n may correspond to sensor $S_n$. Thus, the processor 304 may determine the positions of the first and second sensors 122 on the circuit board 120 by examining the pin numbers of the signal pins 302 that received the respective voltage signals 310 from the first and second sensors 122. The processor 304 may determine the pin number of the third sensor 122 based on the pin number of the first and second sensors 122. For example, when the pin numbers of signal pins 302 corresponding to the first and second sensors 122 are 2 and 4 respectively, the processor 304 may determine the pin number of the signal pin 302 corresponding to the third sensor 122 as 3.

As described above, each sensor 122 is assigned a particular number of packs 202 placed in the rack 100 based on the position of the sensor 122 on the circuit board 120, wherein the particular number (e.g., sensor number 324) corresponding to each sensor 122 equals a number of packs stored in the rack 100 when the magnet 126 is above the sensor 122 or closest to the sensor 122. Additionally, each signal pin 302 is assigned the same number as the sensor 122 that is electrically coupled to the signal pin 302. Thus, based on the pin number of the signal pin 302 of the third sensor 122, processor 304 determines the particular number corresponding to the third sensor 122. The processor assigns the particular number corresponding to the third sensor 122 as the number of packs 202 actually stored in the rack 100. For example, when the pin number of the third sensor 122 is 3, the processor determines the number of packs 202 actually stored in the rack 100 as 3 packs.

In one or more embodiments, the processor 304 may be configured to generate an alert message when the number of packs 202 stored in the rack 100 equals or fall below a pre-configured threshold number of packs 202. For example, processor 304 may be configured to generate the alert message in response to determining that the number of packs 202 stored in the rack 100 equals or has fallen below the pre-configured threshold number of packs 202 that is to be maintained in the rack 100. The alert message may include an identifier of the rack and a number of packs 202 actually stored in the rack. The processor may be configured to transmit the alert message using the network interface 308 to a master controller or a cloud infrastructure. For example, an inventory manager or store clerk may view the alert message and re-load the rack 100.

Shrinkage Reduction in Stores

Theft of merchandise from store shelves is a significant problem that costs the stores substantial losses. Quick and precise detection of a product stolen from a store shelf helps apprehend the thief and recover the stolen product. Packs of cigarettes are often stolen by store clerks who have access to the cigarette racks 100. Currently no effective technical solution exists that can quickly and precisely detect theft of cigarette packs from the cigarette racks.

Embodiments of the present disclosure discuss techniques to intelligently detect theft of packs 202 of cigarettes from racks 100.

Figure 9:
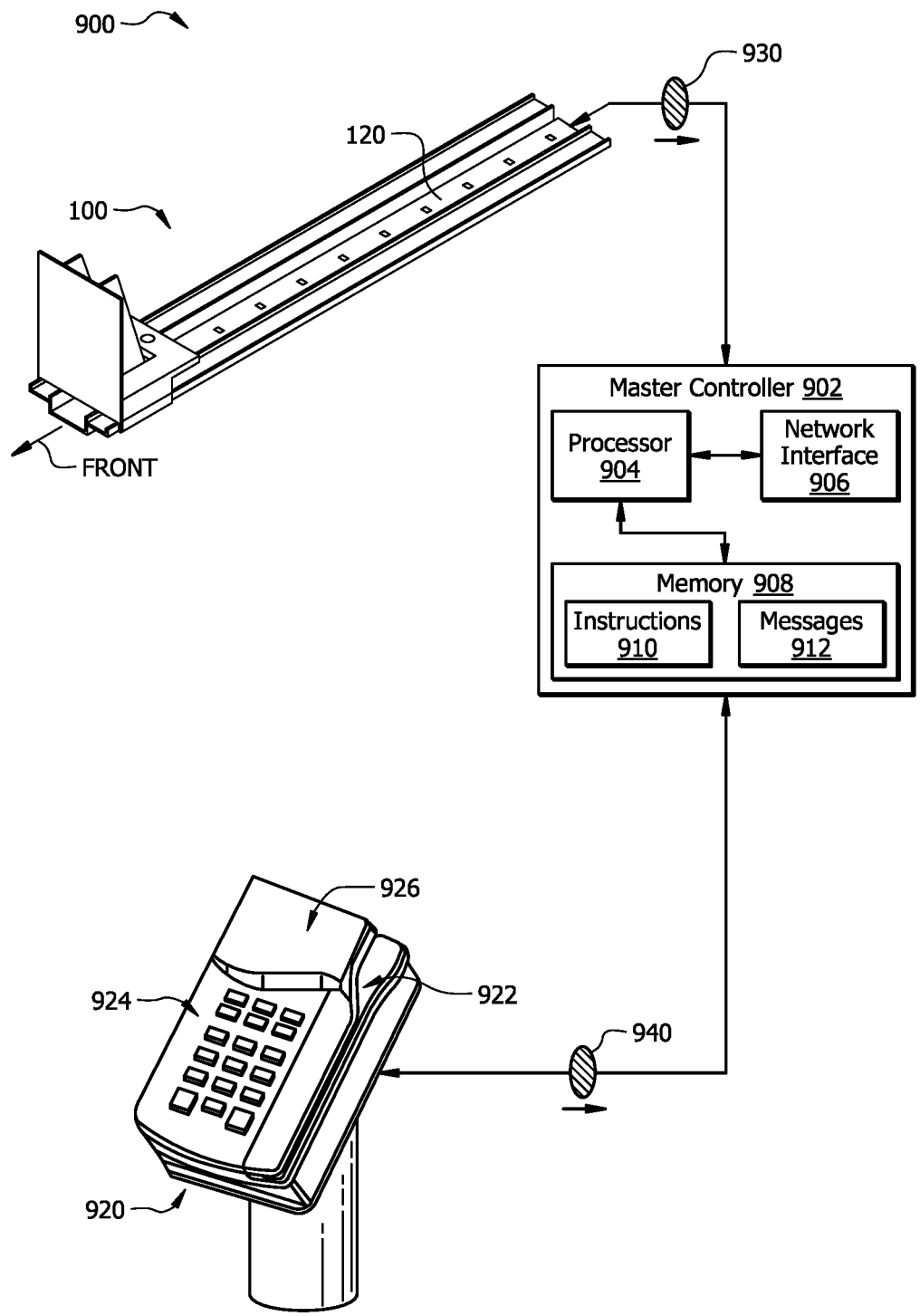
FIG. 9 illustrates a schematic diagram of a system for detecting theft of packs of cigarettes, in accordance with certain embodiments of the present disclosure.

FIG. 9 illustrates a schematic diagram of a system 900 for detecting theft of packs of cigarettes, in accordance with certain embodiments of the present disclosure.

As shown in FIG. 9, system 900 includes a rack 100, an interaction device 920 and a master controller 902 communicatively coupled to the rack 100 and the interaction device 920. Master controller 902 includes a memory 908, a network interface 906 and a processor 904 communicatively coupled to the memory 908 and the network interface 906.

The processor 904 comprises one or more processors operably coupled to the memory 908. The processor 904 is any electronic circuitry including, but not limited to, state machines, one or more central processing unit (CPU) chips, logic units, cores (e.g. a multi-core processor), field-programmable gate array (FPGAs), application specific integrated circuits (ASICs), or digital signal processors (DSPs). The processor 904 may be a programmable logic device, a microcontroller, a microprocessor, or any suitable combination of the preceding. The processor 904 is communicatively coupled to and in signal communication with the memory 908. The one or more processors are configured to process data and may be implemented in hardware or software. For example, the processor 904 may be 8-bit, 16-bit, 32-bit, 64-bit or of any other suitable architecture. The processor 904 may include an arithmetic logic unit (ALU) for performing arithmetic and logic operations, processor registers that supply operands to the ALU and store the results of ALU operations, and a control unit that fetches instructions from memory and executes them by directing the coordinated operations of the ALU, registers and other components.

The one or more processors 904 are configured to implement various instructions 910. For example, the one or more processors 904 are configured to execute instructions 910 to implement the master controller 902. In this way, processor 904 may be a special-purpose computer designed to implement the functions disclosed herein. In one or more embodiments, master controller 902 is implemented using logic units, FPGAs, ASICs, DSPs, or any other suitable hardware. Master controller 902 is configured to operate as described with reference to FIGS. 9-10. For example, master controller 902 may be configured to perform at least a portion of the method 1000 as described in FIG. 10.

The memory 908 comprises one or more disks, tape drives, or solid-state drives, and may be used as an over-flow data storage device, to store programs when such programs are selected for execution, and to store instructions 910 and data that are read during program execution. The memory 908 may be volatile or non-volatile and may comprise a read-only memory (ROM), random-access memory (RAM), ternary content-addressable memory (TCAM), dynamic random-access memory (DRAM), and static random-access memory (SRAM).

The memory 908 is operable to store, among other things, messages 912 including messages 912 received from the rack 100 (e.g., circuit board 120), messages 912 received from the interaction device 920 and instructions 910 for implementing the functionality of the master controller 902. The instructions 910 stored in the memory 908 may include any suitable set of instructions, logic, rules, or code operable to execute the master controller 902.

The network interface 906 is configured to enable wired and/or wireless communications. The network interface 906 is configured to communicate data between the master controller 902 and other devices, systems, or domains (e.g. circuit board 120 of the rack 100, interaction device 920 etc.). For example, the network interface 906 may comprise a Wi-Fi interface, a LAN interface, a WAN interface, a modem, a switch, or a router. The processor 904 is configured to send and receive data using the network interface 906. The network interface 906 may be configured to use any suitable type of communication protocol as would be appreciated by one of ordinary skill in the art.

It may be noted that the interaction device 920 may be implemented similar to the master controller 902 as shown in FIG. 9. For example, the interaction device 920 may include a processor and a memory storing instructions to implement the respective functionality when executed by the processor.

The interaction device 920 may include a point-of-sale (POS) device/terminal. This disclosure may use the terms "interaction device 920" and "POS device/terminal 920" interchangeably. The POS device 920 may be used at a number of businesses including, but not limited to, grocery stores, gas stations, home improvement stores, clothing stores and restaurants to allow users to make payments using a variety of payment instruments such as credit cards, debit cards, smart cards, Automatic Teller Machine (ATM) cards and other touchless payment methods. The POS device 920 may include a card reader 922 that captures account information stored on a magnetic stripe on the back of a credit card or an ATM/debit card. The POS device 920 may additionally include a keypad 924 having a number of buttons with alphanumeric characters and some additional buttons such as "ENTER", "CLEAR" and "CANCEL" allowing the user to enter a PIN associated with an ATM/debit or credit card, a zip code associated with a credit card and/or other information that needs to be entered by the user to complete a payment transaction. The POS device 920 may also include a display screen 926 providing a visual interface for communicating with the user. To perform a payment transaction, a user of the POS device 920 slides a card through the card reader 922. The transaction details are then displayed to the user on the display 926. The user can then enter additional information regarding the transaction, such as a security verification code or a PIN number via keypad 924. The information entered by the user is encrypted and transmitted through a secure communication channel to a bank or other transaction clearinghouse. Once the transaction is approved, the user is notified via the display 926. It may be noted that the POS device 920 shown in FIG. 9 is for exemplary purposes only, and a person having ordinary skill in the art can appreciate that any type of POS device/terminal may be used in the embodiments of the present disclosure.

The interaction device 920 is configured to process data interactions involving one or more packs 202 of cigarettes. A data interaction involving one or more packs 202 of cigarettes may include processing sale of the one or more packs of cigarettes by the interaction device 920.

Figure 10:
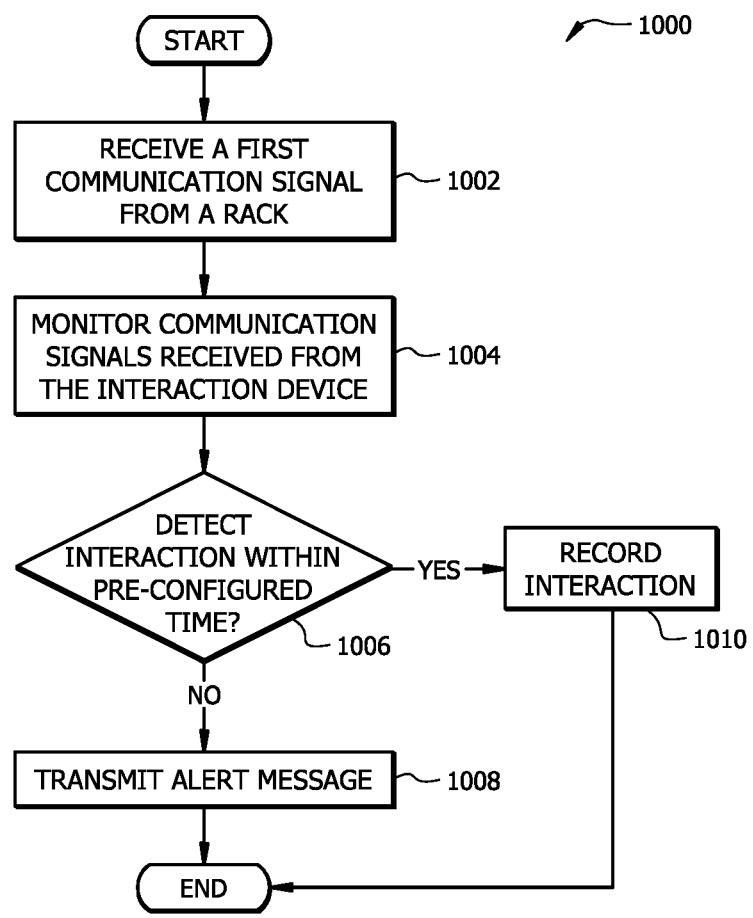
FIG. 10 is a flowchart of an example method for detecting theft of packs of cigarettes stored in a rack, in accordance with certain embodiments of the present disclosure.

FIG. 10 is a flowchart of an example method 1000 for detecting theft of packs of cigarettes stored in a rack 100, in accordance with certain embodiments of the present disclosure. Method 1000 may be performed by the master controller 902 as shown in FIG. 9 and described above.

At operation 1002, the master controller 902 receives a first communication signal 930 (referring back to FIG. 9) from the rack 100. For example, the first communication signal 930 is transmitted by the processor 304 of the circuit board 120 associated with the rack 100 using the network interface 308 and received by the master controller 902 using the network interface 906. The first communication signal 930 includes a first message indicating that a first number of packs 202 of cigarettes has been removed from the rack 100 and further including a universal product code (UPC) associated with a type of the packs 202 of cigarettes stored in the rack 100.

UPC or UPC code is a barcode symbology that is widely used worldwide for tracking items in stores. UPC generally consists of 12 digits that are uniquely assigned to each item. For example, each different type of pack 202 of cigarettes is associated with a different UPC that is generally printed on the pack 202. Thus, a UPC associated with a pack 202 uniquely identifies a type of the pack 202, wherein all packs 202 of the same type are associated with the same UPC.

In certain embodiments, when the processor 304 associated with the circuit board 120 of the rack 100 detects that one or more packs 202 of cigarettes have been removed from the rack 100, the processor 304 generates the first message including at least an indication of the number of packs 202 removed from the rack 100 and the UPC associated with the packs 202 removed from the rack 100. The memory 306 of the circuit board 120 of the rack 100 may store the UPC associated with the packs 202 stored in the rack 100. The processor 304 may obtain the UPC associated with the packs 202 from the memory 306 and include the UPC in the first message. In one or more embodiments, the indication included in the first message of the number of packs 202 removed from the rack 100 includes a number of packs 202 actually stored in the rack 100. For example, the processor 304 is configured to count the number of packs 202 stored in the rack 100, generate the first message including the counted number of packs 202 and the UPC associated with the packs 202, and transmit the first communication signal 930 including the first message to the master controller 902. The processor 304 may be configured to count the number of packs 202 stored in the rack 100 in response to detecting that the magnet 126 has moved along the length of the rack. The processor 304 may detect that the magnet 126 has moved in response to detecting that the voltage values generated by the sensors 122 have changed. The processor 304 may be configured to transmit the first communication signal 930 including the first message to the master controller 902 each time the processor 304 counts the packs 202 stored in the rack 100. Additionally, or alternatively, the processor 304 may transmit the first communication signal 930 to the master controller 902 in response to receiving a command from the master controller 902, periodically, based on a pre-configured schedule and/or based on a pre-configured trigger (e.g., movement of shoe 106/magnet 126). The master controller 902 may be configured to store the count of packs 202 received from the rack 100 in memory 908. Upon receiving the first communication signal 930 from the rack 100, master controller 902 may be configured to extract the number of packs 202 from the first message and compare the received number of packs 202 to a previous number of packs 202 stored in the memory 908. Upon determining, based on the comparison, that the number of packs 202 received in the latest first message is less than the previous number of packs 202 stored in the memory, the master controller 902 determines that at least one pack 202 has been removed from the rack 100. Additionally, based on comparing the latest number of packs with the previous number of packs, the master controller 902 may determine a number of the packs removed from the rack 100.

In an additional or alternative embodiment, the indication the indication included in the first message of the number of packs 202 removed from the rack 100 includes the actual number of packs 202 removed from the rack 100. For example, processor 304 may be configured to store in the memory 306 at least the latest count of packs 202 stored in the rack 100 from the latest counting of packs 202 stored in the rack 100. When the processor 304 counts the packs 202 stored in the rack 100, the processor 304 compares the new count of packs to a previous count of packs stored in the memory 306. Upon determining that the new count is less than the previous count, the processor 304 determines that one or more packs have been removed from the rack 100 and further determines the number of packs removed based on the comparison of the new and previous counts. The processor 304 includes the determined number of packs removed from the rack 100 in the first message for transmitting in the first communication signal 930 to the master controller 902.

At operation 1004, master controller 902 monitors communication signals 940 (referring back to FIG. 9) received from the interaction device 920. The master controller 902 may receive communication signals 940 from the interaction device 920 using the network interface 906. In one embodiment, master controller 902 may start monitoring communication signals 940 received from the interaction device 920 in response to determining (e.g., based on the first communication signal 930 received from the rack 100) that the first number of packs 202 of cigarettes has been removed from the rack 100. The communication signals 940 received from the interaction device 902 may be indicative of data interactions performed at the interaction device 920. For example, when a data interaction involving a product (e.g., involving sale of a product such as one or more packs 202 of cigarettes) is performed at the interaction device 920, the interaction device 920 may be configured to transmit a communication signal 940 to the master controller 902. The communication signal 940 may include a message having information relating to one or more data interactions processed by the interaction device 920. For example, the message may include information relating to a data interaction processed by the interaction device 920 involving one or more packs 202 of cigarettes. This information relating to the data interaction involving the one or more packs 202 of cigarettes may include a number of packs involved as part of the data interaction and a UPC associated with each pack 202 that was involved in the data interaction. For example, the data interaction involving the one or more packs 202 may correspond to a sale of the one or more packs processed by the interaction device 920. As described in further detail below, based on monitoring the communication signals 940 received from the interaction device 920, the master controller 902 may determine whether one or more data interactions involving the packs 202 removed from the rack 100 was processed by the interaction device 920. In one embodiment, the interaction device 920 may be configured to transmit to the master controller 902 communication signals 940 relating to data interactions involving packs 202 of cigarettes only.

At operation 1006, based on communication signals 940 received from the interaction device 920, master controller 902 checks whether a data interaction involving the first number of packs 202 of cigarettes removed from the rack 100 was processed by the interaction device 920 with a pre-configured time period from the time the first number of packs 202 were removed from the rack 100. As described above, a communication signal 940 received from the interaction device 920 may include a message having information relating to data interactions involving packs 202 of cigarettes processed by the interaction device 920. This information may include a number of packs involved as part of a data interaction and a UPC associated with each pack 202 that was involved in the data interaction. Based on the information relating to the data interactions processed by the interaction device 920, master controller 902 may determine whether one or more data interactions involving the packs 202 removed from the rack 100 was processed by the interaction device 920. For example, master controller 902 may compare the UPC associated with each pack that was involved in the data interaction with the UPC associated with the first number of packs that was removed from the rack 100. When the UPC associated with a pack that was involved in the data interaction matches with the UPC associated with the first number of packs that was removed from the rack 100, master controller 902 determines that a data interaction involving a pack removed from the rack 100 was completed by the interaction device. When the master controller 902 is able to confirm UPC matches for the first number of packs removed from the rack 100 with the same number of packs involved in one or more data interactions at the interaction device 920, master controller 902 determines the first number of packs 202 removed from the rack 100 were processed in data interactions at the interaction device 920. On the other hand, when no communication signal 940 is received from the interaction device 920 or when the UPCs of packs involved in one or more data interactions processed by the interaction device 920 do not match the UPCs associated with the packs removed from the rack 100, master controller 902 determines that the first number of packs 202 removed from the rack 100 were not processed in data interactions at the interaction device 920, which is indicative of a potential theft of the first number of packs 202.

Master controller 902 may be configured to determine whether the first number of packs 202 removed from the rack 100 were processed in data interactions at the interaction device 920 within a pre-configured time period from the time the first number of packs 202 were removed from the rack 100. In one embodiment, the master controller 902 starts a timer in response to determining (based on the first communication signal 930) that the first number of packs 202 were removed from the rack 100, wherein the timer is set to expire after the pre-configured time period. If the master controller 902 determines that the first number of packs 202 removed from the rack 100 were processed in data interactions at the interaction device 920 before expiration of the timer, the master controller 902 determines that the first number of packs 202 were processed by the interaction device 920 within the pre-configured time period. In a second embodiment, the first message received as part of the first communication signal 930 from the rack 100 may include a time stamp comprising a time at which the first number of packs 202 was removed from the rack 100. If the master controller 902 determines that the first number of packs 202 removed from the rack 100 were processed in data interactions at the interaction device 920 within the pre-configured time period from the time stamp, the master controller 902 determines that the first number of packs 202 were processed by the interaction device 920 within the pre-configured time period. In a third embodiment, the master controller 902 may be configured to record a time at which the first communication signal 930 was received from the rack 100. If the master controller 902 determines that the first number of packs 202 removed from the rack 100 were processed in data interactions at the interaction device 920 within the pre-configured time period from the recorded time, the master controller 902 determines that the first number of packs 202 were processed by the interaction device 920 within the pre-configured time period.

When the master controller 902 (at operation 1006) determines that the first number of packs 202 removed from the rack 100 were processed in data interactions at the interaction device 920 within the pre-configured time period, method 1000 proceeds to operation 1010, where the master controller 902 records that the first number of packs 202 removed from the rack 100 were processed in one or more data interactions at the interaction device 920.

When the master controller determines (e.g., at operation 1006) that the first number of packs 202 removed from the rack 100 were not processed in data interactions at the interaction device 920 within the pre-configured time period, method 1000 proceeds to operation 1008 where the master controller 902 transmits an alert message (e.g., to a computing device of a store manager or asset protection team). The alert message may include at least one of an indication that packs 202 of cigarettes removed from the rack 100 have not been processed by the interaction device 920, a first number of the packs 202 removed from the rack 100, the UPC associated with the packs 202, a rack number associated with the rack 100 and a time stamp comprising a time at which the packs 202 were removed from the rack 100. In one embodiment, the first message received as part of the first communication signal 930 from the rack 100 includes the rack number associated with the rack. Additionally, or alternatively, the alert message may include an identity of a user (e.g., store clerk) operating the interaction device 920 at the time the first number of packs 202 were removed from the rack 100. Generally, in order to operate the interaction device 920, a user needs to enter security credential unique to the user. The security credential is usually associated with the identity of the user. The interaction device 920 may transmit the identity of the user currently operating the interaction device 920 as part of the communication signal 940 transmitted to the master controller 902. The timely detection and alert of a potential theft along with identity of the user operating the interaction device may help in identifying the party responsible for the theft and recover stolen product. Further, the system may deter potential thieves from attempting to steal product, which also helps shrinkage reduction.

It may be noted that while the method 1000 is described in relation to packs 202 of cigarettes, the method 1000 may be used in relation to any product/item of uniform thickness that can be stored in the rack 100.

FIG. 11 illustrates an example network topology 1100 for connecting a plurality of racks shown in FIG. 1, in accordance with certain embodiments of the present disclosure.

A typical store has several racks 100 arranged in one or more shelves. Network topology 1100 is an example network arrangement of a plurality of racks 100 that are in communication with a master controller 902. As shown in FIG. 11, network topology 1100 includes a plurality or racks 100 (shown as 100*a*, 100*b*, 100*c* . . . 100*n*) and a master controller 902 connected in a daisy chain. Each rack 100 includes an inbound connector (e.g., one or more input pins on the circuit board 120) and an outbound connector (e.g., one or more output pins on the circuit board 120). The inbound connector may be used to receive data from other devices (e.g., other racks 100 or master controller 902) and the outbound connector may be used to transmit data to other devices (e.g., other racks 100 or master controller 902). Each rack 100 may use a respective network interface 308 to receive and transmit data. For example, data received at the inbound connector may be routed to the network interface 308. Further, the network interface 308 may transmit data via the outbound connector.

As shown in FIG. 11, master controller 902 is connected to the inbound connector of the first rack 100*a*. The first rack 100*a* is then connected through its outbound connector to the inbound connector of the second rack 100*b*. This connection sequence is repeated until all racks 100*a-n* are connected, with the last racks 100*n* outbound connector connected back to the Master Controller, forming a ring topology. As shown, data in the daisy chain flows in one direction, from the master controller 902 to the first rack 100*a*, from one rack to the next rack in series, and then back to the master controller 902 from the last rack 100*n* in the daisy chain.

Each rack 100 stores an address in a respective memory 306. The address of a particular rack 100 is what the master controller 902 uses to issue commands to the particular rack 100 and to interpret and associate data coming from the particular rack 100. Addresses may be simple sequence numbers and are initially undefined. At system startup (e.g., a cold start or a reset of the master controller 902) the master controller 902 passes a "Clear Address" command to the first rack 100*a* instructing the rack 100*a* to clear its address. The first rack 100*a* clears its address and then transmits/forwards the same command to the second rack 100*b*. This continues to the end of the daisy chain until the last rack 100*n* sends the "Clear Address" command back to the master controller 902, which indicates to the master controller 902 that all racks have cleared their addresses.

After clearing all of the addresses of all racks 100, the master controller 902 begins a sequence that results in the assignment of addresses to all racks 100 in the network. This begins with a "Set Address" command with an address value of 0x0001 (hexadecimal) passed by the master controller 902 to the first rack 100*a*. Upon receiving this command, the first rack 100*a* sets its address to 0x0001, increments that value by one and passes the "Set Address" command and the new value to the second rack 100*b*. The second rack 100*b* sets its own address, increments the value and passes the command to the third rack 100*c*. This continues down the chain until the last rack 100*n* sets its address, increments the value and passes the "Set Address" command back to the master controller. When the master controller 902 sees this command and address returned to it, it now has a count of the number of racks it is attached to (e.g., the finally received address value minus one). In practice, as long as no racks 100 are added, removed, reconfigured (e.g., moved) or experience failure, racks 100 always have the same address between resets, power cycles, etc.

Once all racks 100 have chosen an address, the master controller 902 may command any one rack for a current count of packs 202 stored in the rack. For example, the master controller 902 may transmit a "Get Current Count" command along with the address of the rack 100. The command is passed down the chain until a target rack with the matching address included in the command receives the command. The target rack transmits a "Current Count" response to the next rack in the chain, wherein the response includes the latest count of packs 202 stored in the target rack and the address of the target rack. The response is passed down the chain to the master controller 902 which knows interprets the response as received from the target rack from the address included in the response. In some embodiments, as discussed above, a rack 100 in the chain may transmit an unsolicited "Count Changed" message (e.g., first message of FIG. 10) to the master controller 902. As described above the "Count Changed" message may be used to determine whether the one or more packs removed from the rack were processed by an interaction device 920.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

To aid the Patent Office, and any readers of any patent issued on this application in interpreting the claims appended hereto, applicants note that they do not intend any of the appended claims to invoke 35 U.S.C. § 112(f) as it exists on the date of filing hereof unless the words "means for" or "step for" are explicitly used in the particular claim.

The invention claimed is:

1. A system for counting packs of cigarettes in a rack, comprising:
 a longitudinal rack that stores a plurality of packs of cigarettes along the length of the rack between a front end and rear end of the rack;
 a shoe movably attached to the rack such that the shoe travels between the front end and the rear end of the rack, wherein the packs of cigarettes are placed adjacent to a front end of the shoe, wherein the shoe is pushed back towards the rear end of the rack with each cigarette pack loaded on the rack;
 a magnet coupled to the shoe; and
 a longitudinal circuit board arranged along the length of the rack and comprising:
  an array of sensors arranged along the length of the circuit board, wherein:
   a spacing between each pair of the sensors corresponds to a thickness of a pack of cigarettes such that, for any number of packs stored in the rack, the magnet is directly above one of the sensors;
   each of the sensors generates a maximum voltage value when the magnet is directly above the sensor; and
   each sensor corresponds to a particular number of packs placed in the rack based on the position of the sensor on the circuit board;
  a memory that stores voltage values generated by the sensors; and
  a processor coupled to the sensors and the memory, wherein the processor is configured to:
   monitor the voltage value generated by at least a subset of sensors of the array of sensors;
   detect that a particular sensor of the array of sensors has generated the maximum voltage value; and
   determine a number of packs of cigarettes actually stored in the rack based on the particular number of packs corresponding to the particular sensor that is detected to generate the maximum voltage value.

2. The system of claim 1, wherein each of the sensors in the array comprises a Hall effect sensor.

3. The system of claim 1, wherein:
 the circuit board further comprises a communication interface coupled to the processor;
 the processor is further configured to:
  determine that the number of packs actually stored in the rack equals or is below a threshold;
  generate an alert message comprising an identifier of the rack and the determined number of packs actually stored in the rack; and
  transmit the alert message to a master controller using the communication interface.

4. The system of claim 1, further comprising:
 a plurality of racks including the rack, wherein the plurality of racks are connected in a daisy chain;
 a master controller connected to a first rack of the daisy chain, wherein a last rack of the daisy chain is connected to the master controller forming a ring topology, wherein the processor is further configured to:
  receive from the master controller a request for the number of packs actually stored in the rack, the request comprising a network address of the rack; and
  generate a count message comprising the network address of the rack and the determined number of packs actually stored in the rack; and
  transmit the count message to a next rack on the daisy chain.

5. The system of claim 1, wherein:
 the particular number corresponding to each sensor from the array equals a number of packs stored in the rack when the magnet is above the sensor; and
 determining the number of packs comprises assigning the particular number corresponding to the particular sensor as the number of pack of cigarettes stored in the rack.

6. The system of claim 5, wherein:
 the circuit board further comprises an array of signal pins, wherein each sensor is electrically coupled to one of the signal pins and outputs a voltage signal generated by the sensor to the signal pin; and
 the processor is configured to monitor the voltage values generated by the subset of sensors by monitoring the voltage signals received at each of the signal pins.

7. The system of claim 1, further comprising a mechanism coupled to the shoe that drives the shoe towards the front end of the rack causing a frontmost pack of cigarette stored in the rack to press against a front wall near the front of the rack.

8. The system of claim 7, wherein the mechanism coupled to the shoe comprises a coiled spring that drives the shoe towards the front end of the rack.

9. The system of claim 1, further comprising a magnet carrier attached to the shoe and configured to hold the magnet.

10. The system of claim 9, wherein:
 the magnet is arranged in the magnet carrier such that a longitudinal axis of the magnet is perpendicular to the longitudinal circuit board; and
 each of the sensors generates the maximum voltage value when the magnet is closest to the sensor.

11. The system of claim 9, wherein the magnet carrier is positioned at a rear end of the shoe.

12. A circuit board for counting packs of cigarettes stored in a rack, comprising:
 an array of sensors arranged along the length of the circuit board, wherein:
  the circuit board is arranged along a length of the rack that stores a plurality of packs of cigarettes along the length of the rack between a front end and a rear end of the rack;
  a magnet travels along the length of the rack between the front end and the rear end of the rack;
  a spacing between each pair of the sensors corresponds to a thickness of a pack of cigarettes stored in the rack such that, for any number of packs stored in the rack, the magnet is directly above one of the sensors;
  each of the sensors generates a maximum voltage value when the magnet is directly above the sensor; and
  each sensor corresponds to a particular number of packs placed in the rack based on the position of the sensor on the circuit board;
 a memory that stores voltage values generated by the sensors; and
 a processor coupled to the sensors and the memory, wherein the processor is configured to:

monitor the voltage value generated by at least a subset of sensors of the array of sensors;

detect that a particular sensor of the array of sensors has generated the maximum voltage value; and determine a number of packs of cigarettes actually stored in the rack based on the particular number of packs corresponding to the particular sensor that is detected to generate the maximum voltage value.

13. The circuit board of claim 12, wherein each of the sensors in the array comprises a Hall effect sensor.

14. The circuit board of claim 12, further comprising:
a communication interface coupled to the processor;
wherein the processor is further configured to:
    determine that the number of packs actually stored in the rack equals or is below a threshold;
    generate an alert message comprising an identifier of the rack and the determined number of packs actually stored in the rack; and
    transmit the alert message to a master controller using the communication interface.

15. The circuit board of claim 12, wherein:
the particular number corresponding to each sensor from the array equals a number of packs stored in the rack when the magnet is above the sensor; and
determining the number of packs comprises assigning the particular number corresponding to the particular sensor as the number of pack of cigarettes stored in the rack.

16. The circuit board of claim 15, further comprising:
an array of signal pins, wherein each sensor is electrically coupled to one of the signal pins and outputs a voltage signal generated by the sensor to the signal pin; and
wherein the processor is configured to monitor the voltage values generated by the subset of sensors by monitoring the voltage signals received at each of the signal pins.

17. A system for counting packs of cigarettes in a rack, comprising:
a longitudinal rack that stores a plurality of packs of cigarettes along the length of the rack between a front end and rear end of the rack;
a shoe movably attached to the rack such that the shoe travels between the front end and the rear end of the rack, wherein the packs of cigarettes are placed adjacent to a front end of the shoe, wherein the shoe is pushed back towards the rear end of the rack with each cigarette pack loaded on the rack;
a magnet coupled to the shoe;
a longitudinal circuit board arranged along the length of the rack and comprising:
    an array of sensors arranged along the length of the circuit board, wherein:
        a spacing between each pair of the sensors corresponds to a thickness of a pack of cigarettes such that, for any number of packs stored in the rack, the magnet is directly above one of the sensors;
        each of the sensors generates a zero voltage value or a near zero voltage value when the magnet is above the sensor and neighboring sensors on either side of the sensor generate half of a maximum absolute voltage value or near half of the maximum absolute voltage value; and
        each sensor corresponds to a particular number of packs placed in the rack based on the position of the sensor on the circuit board;
    a memory that stores voltage values generated by the sensors; and
    a processor coupled to the sensors and the memory, wherein the processor is configured to:
        monitor the voltage value generated by at least a subset of sensors of the array of sensors;
        detect that a first sensor has generated a first highest absolute voltage value and a second sensor has generated a second highest absolute voltage value, wherein the first highest absolute voltage value and the second highest absolute voltage value are the two highest voltage values out of the voltage values generated by the sensors in the array;
        in response to the detecting, determine that the magnet is positioned above a third sensor that is disposed between the first sensor and the second sensor; and
        determine a number of packs of cigarettes actually stored in the rack based on the particular number of packs corresponding to the third sensor that is disposed between the first sensor and the second sensor.

18. The system of claim 17, wherein:
the circuit board further comprises a communication interface coupled to the processor;
the processor is further configured to:
    determine that the number of packs actually stored in the rack equals or is below a threshold;
    generate an alert message comprising an identifier of the rack and the determined number of packs actually stored in the rack; and
transmit the alert message to a master controller using the communication interface.

19. The system of claim 17, further comprising a magnet carrier attached to the shoe and configured to hold the magnet.

20. The system of claim 19, wherein:
the magnet is arranged in the magnet carrier such that a longitudinal axis of the magnet is parallel to the longitudinal circuit board.

21. The system of claim 17, wherein:
the particular number corresponding to each sensor from the array equals a number of packs stored in the rack when the magnet is above the sensor; and
determining the number of packs comprises assigning the particular number corresponding to the particular sensor as the number of pack of cigarettes stored in the rack.

22. The system of claim 21, wherein:
the circuit board further comprises an array of signal pins, wherein each sensor is electrically coupled to one of the signal pins and outputs a voltage signal generated by the sensor to the signal pin; and
the processor is configured to monitor the voltage values generated by the subset of sensors by monitoring the voltage signals received at each of the signal pins.

* * * * *